(12) United States Patent
Furukawa et al.

(10) Patent No.: US 7,733,210 B2
(45) Date of Patent: Jun. 8, 2010

(54) MAGNETIC FIELD DETECTOR AND MANUFACTURING METHOD THEREOF

(75) Inventors: Taisuke Furukawa, Tokyo (JP); Hiroshi Kobayashi, Tokyo (JP); Takashi Takenaga, Tokyo (JP); Takeharu Kuroiwa, Tokyo (JP); Beysen Sadeh, Tokyo (JP); Masakazu Taki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 931 days.

(21) Appl. No.: 11/378,645

(22) Filed: Mar. 20, 2006

(65) Prior Publication Data

US 2007/0069849 A1 Mar. 29, 2007

(30) Foreign Application Priority Data

Sep. 26, 2005 (JP) ............................. 2005-277466

(51) Int. Cl.
*H01L 43/00* (2006.01)

(52) U.S. Cl. .............................. 338/32 R; 324/207.21; 324/252

(58) Field of Classification Search ................ 338/32 R
See application file for complete search history.

(56) References Cited

U.S. PATENT DOCUMENTS

| | | | |
|---|---|---|---|
| 5,695,858 A | 12/1997 | Maeda et al. | |
| 6,977,497 B1 * | 12/2005 | Yokotani et al. | 324/207.21 |
| 7,385,790 B2 * | 6/2008 | Inomata et al. | 360/324.1 |
| 2002/0034055 A1 | 3/2002 | Seyama et al. | |
| 2004/0027712 A1 | 2/2004 | Yokotani et al. | |

FOREIGN PATENT DOCUMENTS

| | | | |
|---|---|---|---|
| JP | 7-312449 A | | 11/1995 |
| JP | 8-201492 A | | 8/1996 |
| JP | 10142263 A | * | 5/1998 |
| JP | 11-311543 A | | 11/1999 |
| JP | 2001-345498 | | 12/2001 |
| JP | 2002-92829 A | | 3/2002 |
| JP | 2004-69546 | | 3/2004 |
| WO | WO 2005/081007 | | 9/2005 |

* cited by examiner

*Primary Examiner*—Elvin G Enad
*Assistant Examiner*—Joselito Baisa
(74) *Attorney, Agent, or Firm*—Leydig, Voit & Mayer, Ltd.

(57) ABSTRACT

A magnetic field detector includes: a magnet; a detecting magnetic resistance element having a layer structure containing a ferromagnetic layer, the resistance being changed when a direction of magnetization of the ferromagnetic layer is changed; and a reference magnetic resistance element having substantially the same layer structure as that of the detecting magnetic resistance element. A magnetic field, the magnetic intensity of which is higher than the saturation magnetic field, is impressed by the magnet in a direction which is sensed by the ferromagnetic layer of the reference magnetic resistance element.

20 Claims, 16 Drawing Sheets

■ MAGNETIC FLUX GUIDE IS NOT PROVIDED
○ MAGNETIC FLUX GUIDE IS PROVIDED

MAGNETIC FIELD DETECTOR AND MANUFACTURING METHOD THEREOF

BACKGROUND OF THE INVENTION

1. Field of the Invention

The present invention relates to a magnetic field detector in which a magnetic resistance element is used and a method of manufacturing the magnetic field detector.

2. Description of the Related Art

Hall element is conventionally used for the magnetic field detector. It is possible to enhance the accuracy of the magnetic field detector by increasing a ratio of a detection signal to a noise. Therefore, in order to detect the magnetic field with high accuracy, it is desirable to obtain a higher intensity of signal, that is, it is desirable to increase a resistance change ratio that is changed by the magnetic field. From the above viewpoints, the magnetic resistance element, in which Giant Magneto-resistance (GMR) or Tunnel Magneto-resistance (TMR) is used, has been developed.

This magnetic resistance element detects a change in the outside magnetic field as a change in the resistance. However, the resistance of the magnetic resistance element is also changed by the temperature. Therefore, in an environment in which the outside temperature is greatly changed, it is difficult to use the magnetic resistance element as a magnetic sensor. JP-A-2001-345498 discloses a magnetic detector to solve the above problems. The magnetic detector disclosed in JP-A-2001-345498 is composed in such a manner that a tunnel magnetic resistance element, which is magnetically shielded, and a tunnel magnetic resistance element, which is not magnetically shielded, are connected to each other by the bridge connection so that an influence made by the change in the resistance when the temperature is changed can be reduced. The magnetic resistance element, which is not magnetically shielded, is used as a magnetic resistance element for detection, the resistance of which is changed by the outside magnetic field. The tunnel magnetic resistance element, which is magnetically shielded, is used as a magnetic resistance element for reference, the resistance of which is not changed by the outside magnetic field. In this case, the performance of the magnetic resistance element, which is magnetically shielded, and the performance of the magnetic resistance element, which is not magnetically shielded, are the same.

SUMMARY OF THE INVENTION

In the prior art, the magnetic resistance element used for detection, which is not magnetically shielded, the resistance of which is changed by the outside magnetic field, and the magnetic resistance element used for reference, which is magnetically shielded, the resistance of which is not changed by the outside magnetic field, are used for detecting the magnetic filed. Therefore, the following problems are caused. At the time of detection, the same outside magnetic field is impressed upon the magnetic resistance element, which is magnetically shielded, and the magnetic resistance element which is not magnetically shielded. In order to detect the magnetic field with high accuracy, it is necessary for the magnetic resistance element used for reference to be perfectly magnetically shielded so that the magnetic resistance element can not be affected by the outside magnetic field.

The invention has been accomplished to solve the above problems. It is an object of the invention to provide a magnetic field detector having a magnetic resistance element used for reference, the structure of which is simple, in which no magnetic shield structure is provided and the resistance of the magnetic resistance element is not changed by the outside magnetic field.

A magnetic field detector of the invention includes: a magnet; a magnetic resistance element used for detection having a layer structure containing a ferromagnetic layer, the resistance being changed when a direction of magnetization of the ferromagnetic layer is changed; and a magnetic resistance element used for reference having the substantially same layer structure as that of the magnetic resistance element used for detection, wherein a magnetic field, the magnetic intensity of which is higher than the saturation magnetic field, is impressed by the magnet in the direction which is felt by the ferromagnetic layer of the magnetic resistance element used for reference.

The layer structure of the magnetic resistance element used for reference is substantially the same as that of the magnetic resistance element used for detection. Therefore, a change in the resistance of the magnetic resistance element used for reference caused by a change in the temperature is approximately the same as that of the magnetic resistance element used for detection. Upon the magnetic resistance element used for reference, a magnetic field, the intensity of which is not lower than the saturation magnetic field of the ferromagnetic layer, is impressed by the magnet in the magnetic feeling direction. Therefore, the resistance of the magnetic resistance element used for reference is not changed by the outside magnetic field. Accordingly, this magnetic resistance element used for reference is suitable for the correction of a change in the resistance of the magnetic resistance element used for detection which depends upon the temperature. According to the invention, it is possible to provide a magnetic field detector including a magnetic resistance element used for reference of a simple structure having no magnetic shield structure, the resistance of which is not changed by the outside magnetic field.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Figure 1A:
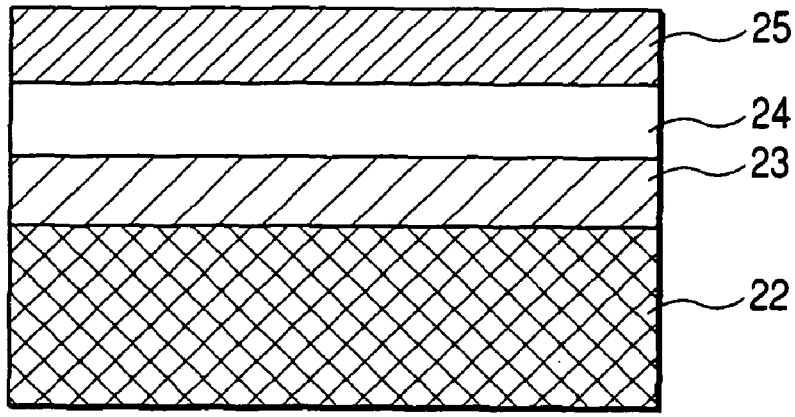
FIG. 1A is a schematic illustration for explaining a film structure of the spin bulb structure and FIG. 1B is a schematic illustration for explaining a film structure of the SAF structure.

Referring to the drawings, explanations will be made into a magnetic field detector of an embodiment of the invention and a method of manufacturing the magnetic field detector. In this explanations, the same components or the components having the same function are attached with the same reference numerals and the duplicate explanations are omitted here.

Embodiment 1

Explanations will be made into GMR element and TMR element having a spin bulb structure used as a magnetic resistance element having a ferromagnetic layer in the layer structure, wherein the resistance is changed by a change in the direction of magnetization of the ferromagnetic layer.

The spin bulb structure includes: a fixed layer, the magnetization direction of which is fixed in one direction on the layer; and a free layer, the magnetization direction of the ferromagnetic layer of which is changed on the layer being affected by the outside magnetic field. For example, as shown in FIG. 1A, the spin bulb structure includes: a first anti-ferromagnetic layer 22; a first ferromagnetic layer 23 provided coming into contact with the first anti-ferromagnetic layer; a first non-magnetic layer 24 provided coming into contact with the first ferromagnetic layer 23 on the face opposite to the first anti-ferromagnetic layer 22; and a second ferromagnetic layer 25 provided coming into contact with the first non-magnetic layer 24 on the face opposite to the first ferromagnetic layer 23. In this layer structure, the magnetization direction of the first ferromagnetic layer 23 is fixed in one direction by the switched connection magnetic field with the first anti-ferromagnetic layer. Therefore, the first ferromagnetic layer 23 becomes a fixed layer. On the other hand, the direction of the magnetic field of the second ferromagnetic layer 25 can be freely rotated by the outside magnetic field. Therefore, the second ferromagnetic layer 25 becomes a free layer. Resistance of the magnetic resistance element having the spin bulb structure is changed according to an angle formed between the magnetization direction of the fixed layer and the magnetization direction of the free layer. That is, when the magnetization direction of the free layer is changed being affected by the outside magnetic field, the resistance is changed. Therefore, a change in the magnetization direction of the free layer caused by the outside magnetic field can be detected in the form of the resistance of the element.

Figure 1B:
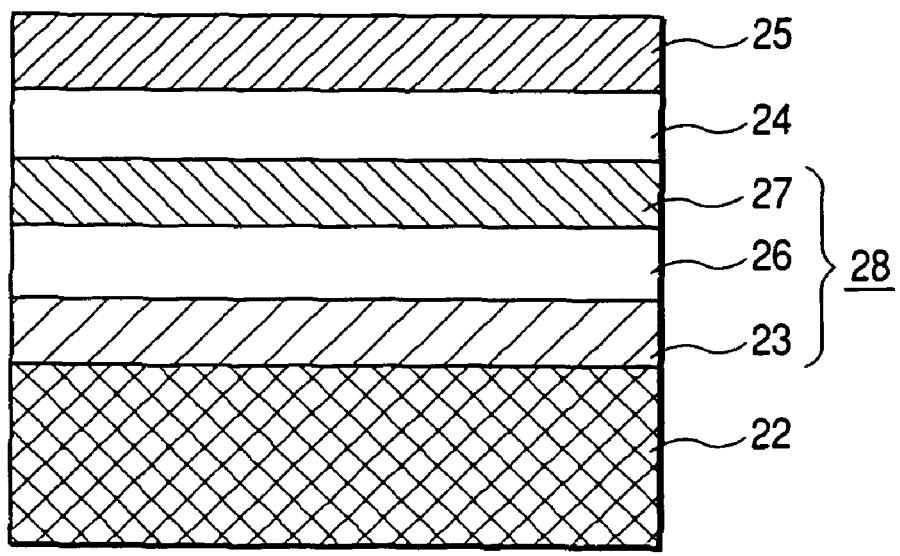

As shown in FIG. 1B, instead of the first ferromagnetic layer 23 described above, the first ferromagnetic layer 23, the second non-magnetic layer 26 and the third ferromagnetic layer 27 are successively laminated on the anti-ferromagnetic layer 22 so as to compose the fixed layer 28. This structure is referred to as SAF (Synthetic Anti-ferromagnetic, that is, artificially anti-ferromagnetic layer structure). It is possible to adopt a layer structure containing this layer structure. In this case, magnetization of the entire fixed layer 28 substantially becomes zero. Therefore, even when a strong magnetic field is impressed in the direction perpendicular to the magnetization direction of the fixed layer 28, the magnetization direction of the fixed layer 28 can be stabilized.

GMR element detects a change in the resistance in the case where an electric current is made to flow in the direction parallel with the layer structure of the magnetic resistance element. TMR element detects a change in the tunnel electric current flowing via an insulating film when the first non-magnetic layer 24 is composed of the insulating film.

In order to compose TRM element, for example, the anti-ferromagnetic layer 22 can be made of IrMn, the first ferromagnetic film 23 can be made of NiFe or CoFe, the non-magnetic layer (insulating layer) can be made of $Al_2O_3$, and the second ferromagnetic layer 25 can be made of NiFe. In order to compose TMR element, the anti-ferromagnetic layer 22 can be made of FeMn, IrMn or PtMn, the ferromagnetic body can be made of metal, the primary component of which is Co, Ni and Fe, such as Co, Fe, CoFe alloy, CoNi alloy or CoFeNi. Alternatively, alloy such as NiMnSb or $CO_2MnGe$ can be used. The non-magnetic layer, which is a tunnel insulating layer, may be an insulating body. Examples of the insulating body are metallic oxides such as $Ta_2O_5$, $SiO_2$ and MgO. Alternatively, the insulating body may be fluoride. The second non-magnetic layer 66 of SAF structure can be made of non-magnetic material such as Ru or Cu.

The above respective films are formed, for example, by the method of magnetron spattering. Alternatively, the above respective films may be formed, for example, by the molecular beam epitaxis (MBE) method, various spattering method, the chemical vapor phase developing (CVD) method or the vapor deposition method.

The respective magnetic resistance elements are made when patterns are formed by means of photolithography and reactive ion etching. In this case, first, after the free layer, the tunnel insulating film and the fixing film have been respectively formed, a photo resist pattern, the shape of which is the same as a desirable element shape, is formed. After that, a film structure, the shape of which is the desirable element shape, is obtained by means of ion milling or reactive ion etching. For the pattern formation of the element shape, the electron beam lithography or the focusing ion beam may be used. For measuring the resistance of the element, wiring made of Al may be used.

Figure 2:
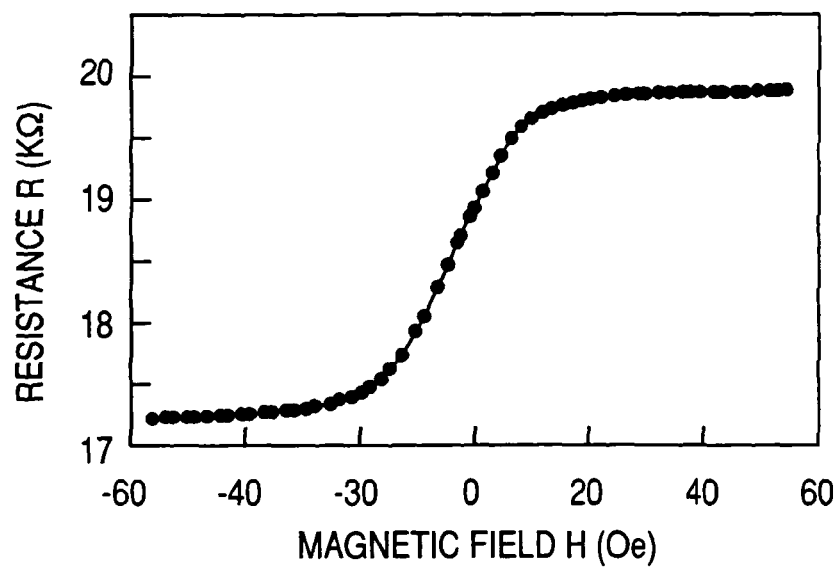
FIG. 2 is a graph showing an example of the magnetic field-resistance characteristic of TMR element.

It is possible to compose a magnetic resistance element in which the free layer and the fixed layer meet at right angles with each other when the outside magnetic field is not impressed. When a magnetic field is impressed in the direction parallel with the magnetizing direction of the fixed layer of such a magnetic resistance element, the magnetizing direction of the free layer is changed by the outside magnetic field, and the resistance of the magnetic resistance element is changed. In the relation between the intensity of the outside magnetic field to be impressed and the resistance of the magnetic resistance element, a saturation region exists in which the resistance does not depend upon the outside magnetic field, and a linear region also exists in which the resistance linearly depends upon the outside magnetic field. In the saturation region, the magnetizing direction of the free layer and the magnetizing direction of the fixed layer are parallel with each other or not parallel with each other FIG. 2 is a characteristic diagram showing an example of the magnetic resistance characteristic of TMR element. In general, the resistance of TMR element and GMR element is minimized when the magnetizing direction of the free layer and the magnetizing direction of the fixed layer are parallel with each other. The resistance of TMR element and GMR element is maximized when the magnetizing direction of the free layer and the magnetizing direction of the fixed layer are not parallel with each other.

Since the thickness of the layer structure of GMR element and TMR element having a spin bulb structure is not more than 1/100 with respect to the element pattern size, those elements are strongly affected by the anisotropy of the shape. Since it is very difficult to change the magnetizing direction in the direction perpendicular to the base board, it is possible to neglect a change in the resistance in the case where a magnetic field is impressed upon the base board in the perpendicular direction. In other words, the magnetic resistance element is an element for detecting a change in the magnetic field parallel with the base board, that is, the magnetic resistance element is an element which does not feel magnetism in the direction perpendicular to the base board on which the elements are formed. As described above, in general, many of the magnetic resistance elements have a direction in which a ratio of the change in the resistance with respect to the change in the magnetic field is substantially zero. In other words, many of the magnetic resistance elements have a direction in which the magnetic resistance elements do not feel magnetism.

Figure 3:
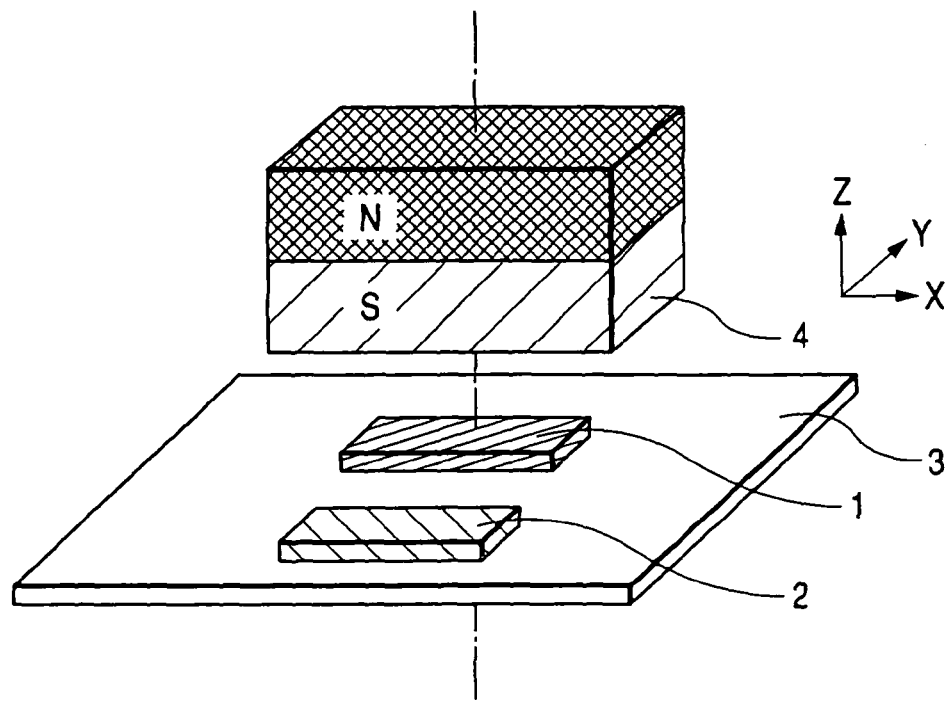
FIG. 3 is a perspective view showing a structure of the magnetic field detector of Embodiment 1.

Next, the structure and the action of Embodiment 1 will be explained below. FIG. 3 is a perspective view showing a fundamental structure of Embodiment 1. The magnetic resistance element 1 used for detection and the magnetic resistance element 2 used for reference are arranged on the base board 3. The magnetic resistance element 1 used for detection and the magnetic resistance element 2 used for reference are TMR elements having a layer structure including a ferromagnetic layer, the resistance of which is changed by the change in the magnetizing direction of the ferromagnetic layer. The magnetic resistance element 1 used for detection and the magnetic resistance element 2 used for reference are made in such a manner that the fixed layer, the insulating layer and the free layer formed on the same base board 3 are made by conducting the pattern processing. Therefore, the layer structure of the magnetic resistance element 1 used for detection and that of the magnetic resistance element 2 used for reference are the same. The element pattern of the magnetic resistance element 1 used for detection and that of the magnetic resistance element 2 used for reference are the same.

At a position above the magnetic resistance element 1 used for detection and obliquely above the magnetic resistance element 2 used for reference, the magnet 4, which is a samarium cobalt magnet, is arranged. The magnet 4 is a bar magnet, the end faces of N-pole and S-pole of which are square. The size of the S-pole end face opposed to the magnetic resistance element 1 used for detection is larger than the size of the element pattern of the magnetic resistance element 1 used for detection. An axis connecting the center of N-pole of the magnet 4 with the center of S-pole is perpendicular to the base board 3 and passes through the substantial center of the magnetic resistance element 1 used for detection. In this connection, in the drawings shown after FIG. 3, the axis connecting the center of N-pole of the magnet 4 with the center of S-pole is expressed by a one-dotted chain line.

Figure 4:
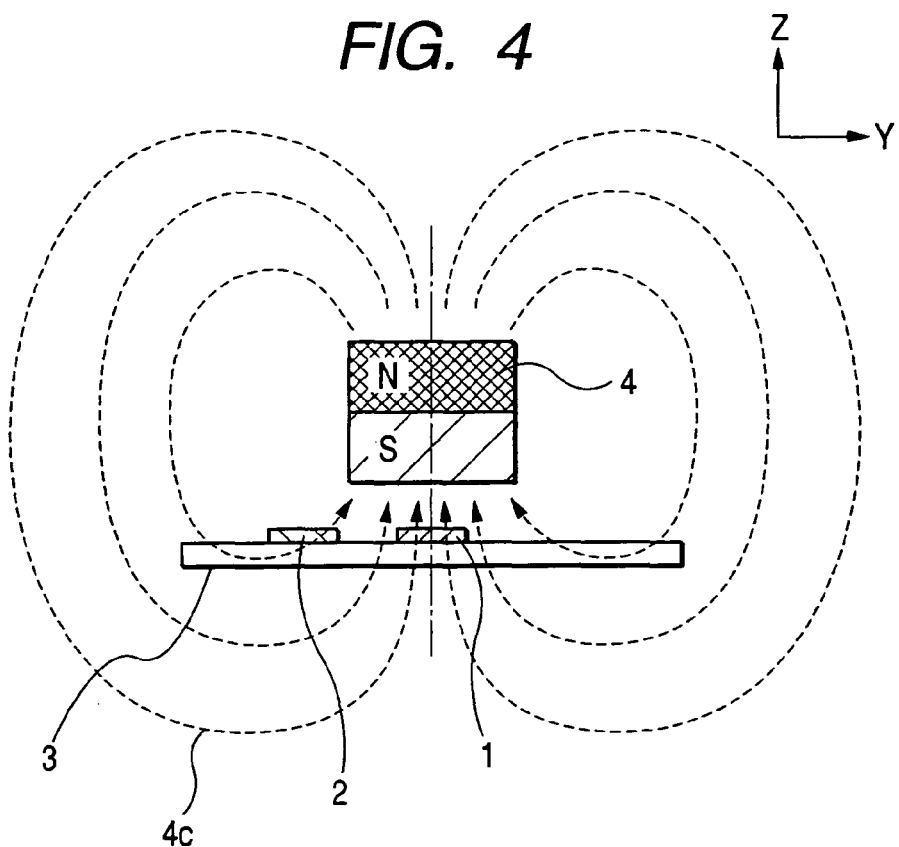
FIG. 4 is a sectional view showing a structure of the magnetic field detector of Embodiment 1.

FIG. 4 is a sectional view including an axis connecting the center of N-pole with the center of S-pole of the magnet 4 which is viewed in the direction of X-axis parallel with the face of base board 3 in FIG. 3. The magnetic field direction 4c of the magnet at the position of the magnetic resistance element 1 used for detection is substantially perpendicular to the base board 3, that is, substantially perpendicular to the film structure. The magnetic field direction 4c of the magnet at the position of the magnetic resistance element 2 used for reference has a higher intensity in the facial direction of the layer structure than that of the saturation magnetic field of the magnetic resistance element 2 used for reference.

Figure 5:
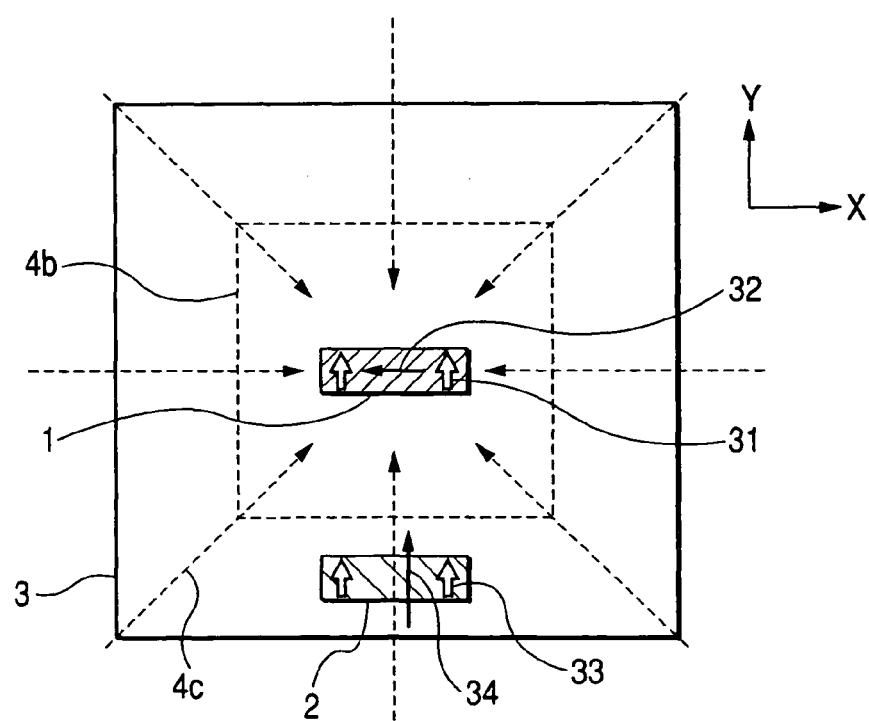
FIG. 5 is an upper view showing a structure of the magnetic field detector of Embodiment 1.

FIG. 5 is an upper view showing a positional relation among the magnetic resistance element 1 used for detection, the magnetizing direction of the magnetic resistance element 2 used for reference, the magnet 4 and a portion of the magnetic field direction 4c of the magnet, wherein the view is taken in the direction of Z-axis perpendicular to the base board 3 of FIG. 3. In FIG. 5, the magnetic resistance element 1 used for detection is located at the center of the projection shape 4b of the magnetic pole end face of the magnet, and the magnetic resistance element 2 used for reference is located outside the center of the projection shape 4b of the magnetic pole end face of the magnet. The magnetizing direction 31 of the fixed layer of the magnetic resistance element 1 used for detection is parallel with the magnetizing direction 33 of the fixed layer of the magnetic resistance element 2 used for reference. The magnetic resistance element 2 used for reference is arranged at a position separate from the position of the magnetic resistance element 1 by an interval in the direction opposite to the magnetizing direction 31 of the fixed layer of the magnetic resistance element used for detection.

When the magnet 4 is not arranged, the magnetizing direction 32 of the free layer of the magnetic resistance element used for detection and the magnetizing direction 34 of the free layer of the magnetic resistance element used for reference are respectively perpendicular to the magnetizing direction 31 of the fixed layer of the magnetic resistance element used for detection and the magnetizing direction 33 of the fixed layer of the magnetic resistance element used for reference. Since the magnet 4 is arranged as described above, a magnetic field is impressed upon the magnetic resistance element 1 used for detection in the direction perpendicular to the base board, that is, in the direction in which the magnetism is not felt. Accordingly, even when the magnet 4 is arranged, the magnetizing direction 32 of the free layer of the magnetic resistance element used for detection is perpendicular to the magnetizing direction 31 of the fixed layer of the magnetic resistance element used for detection.

On the other hand, upon the magnetic resistance element 2 used for reference, a magnetic field, the intensity of which is higher than that of the saturation magnetic field, is impressed by the magnet 4 in the facial direction of the layer structure, that is, in the direction in which the magnetism is felt. As shown in FIG. 5, the magnetizing direction 34 of the free layer of the magnetic resistance element used for reference is fixed along the magnetic field direction 4c of the magnet.

The magnetic field direction 4c of the magnet at the position of the magnetic resistance element 2 used for reference is parallel with the magnetizing direction 33 of the fixed layer of the magnetic resistance element used for reference. The magnetizing direction 34 of the free layer of the magnetic resistance element used for reference is parallel with the magnetizing direction 33 of the fixed layer of the magnetic resistance element used for reference, and the resistance of the magnetic resistance element used for reference becomes minimum.

Figure 6:
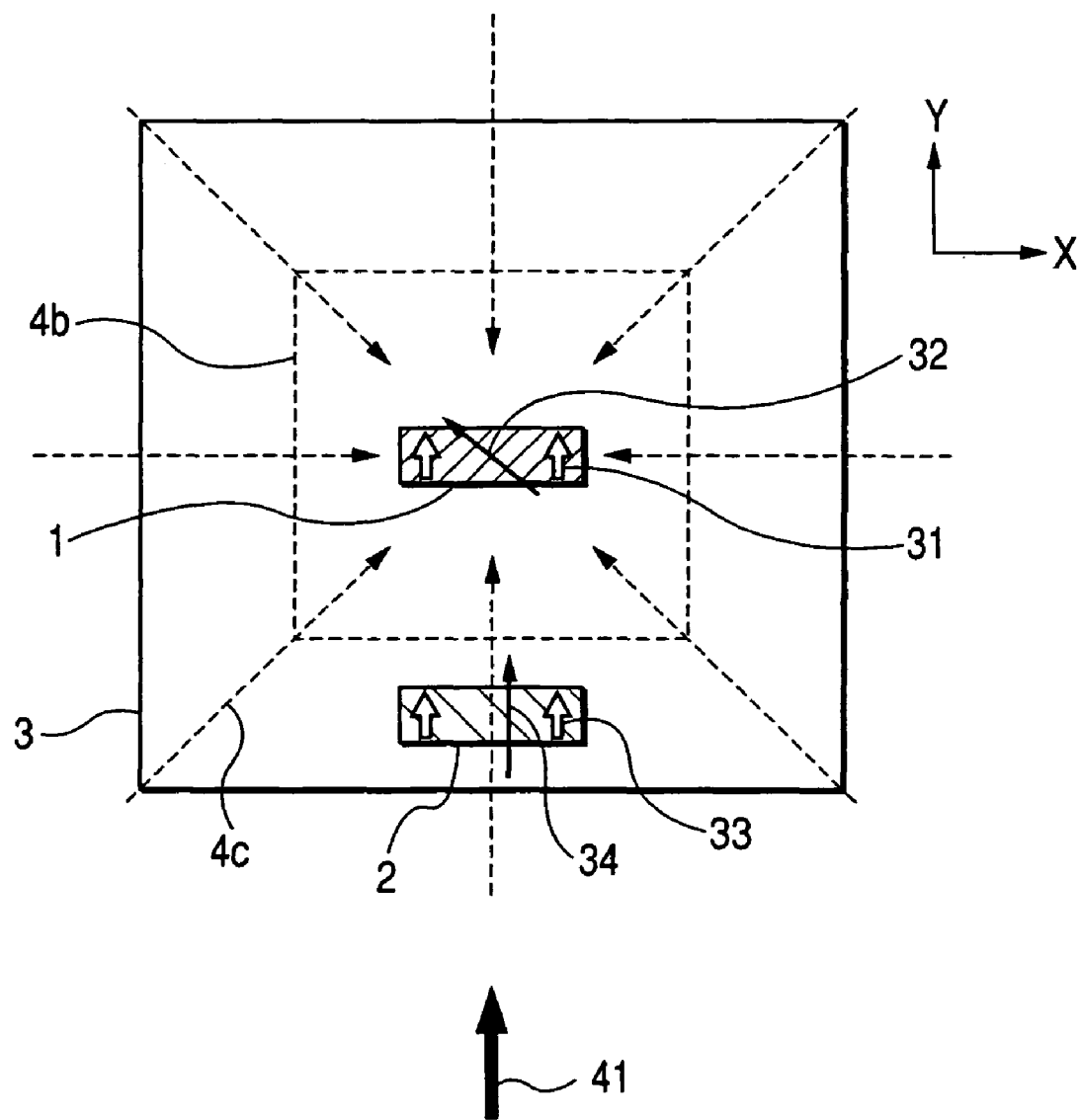
FIG. 6 is an upper view showing a structure of the magnetic field detector of Embodiment 1 upon which the outside magnetic field is impressed.

FIG. 6 is an upper view in the case where the outside magnetic field 41 is impressed in the magnetizing direction of the fixed layers of the magnetic resistance element 1 used for detection and the magnetic resistance element 2 used for reference. The magnetic resistance element 2 used for reference is impressed with a magnetic field obtained when the magnetic field of the magnet 4 and the outside magnetic field 41 are combined with each other by vector composition. However, since the magnetic field of the magnet 4 is sufficiently higher than the outside magnetic field 41, the magnetizing direction 34 of the free layer of the magnetic resistance element 2 used for reference is substantially fixed in one direction.

The magnetizing direction 34 of the free layer of the magnetic resistance element used for reference is saturated by the magnetic field of the magnet 4 in parallel with the magnetizing direction 33 of the fixed layer of the magnetic resistance element used for reference. Therefore, the resistance of TMR element is not changed by the outside magnetic field 41. On the other hand, concerning the magnetic resistance element 1 used for detection, the magnetizing direction 32 of the free layer of the magnetic resistance element used for detection is changed according to the intensity of the outside magnetic field 41. Therefore, its resistance is changed. A change in the resistance of the magnetic resistance element 1 used for detection depending upon the temperature is approximately the same as a change in the resistance of the magnetic resistance element 2 used for reference depending upon the temperature. Therefore, it is possible to correct an influence of the resistance change of the magnetic resistance element 1 used for detection depending upon the temperature by using the resistance of the magnetic resistance element 2 used for reference, the resistance of which is not changed by the outside magnetic field 41.

Although not shown in the drawing, as a means for detecting the outside magnetic field 41 by the resistance of the magnetic resistance element 2 used for reference and the resistance of the magnetic resistance element 1 used for detection, a method of using a bridge circuit is provided, in which the magnetic resistance element 1 used for detection and the magnetic resistance element 2 used for reference are connected to each other in series and a constant voltage is impressed upon between both end portions so as to measure an electrical potential between the magnetic resistance element 1 used for detection and the magnetic resistance element 2 used for reference. In this case, a ratio of the resistance of the magnetic resistance element 1 used for detection to the resistance of the magnetic resistance element 2 used for reference can be obtained from a ratio of the voltage to the constant voltage. Therefore, it becomes possible to correct an influence of the resistance change caused depending upon the temperature. In the case where it can be assumed that a change in the resistance depending upon the temperature is added to the original resistance of the magnetic resistance element, it is possible to use a circuit for detecting a difference between the resistance of the magnetic resistance element 2 used for reference and the resistance of the magnetic resistance element 1 used for detection.

When an outside magnetic field, the intensity of which is not less than that of a specific magnetic field, is impressed, it can be detected by a circuit capable of judging that a ratio of the resistance of the magnetic resistance element 1 used for detection to the resistance of the magnetic resistance element 2 used for reference is not less than a predetermined value or not more than a predetermined value or can be detected by a circuit capable of judging that a difference between the resistance of the magnetic resistance element 1 used for detection and the resistance of the magnetic resistance element 2 used for reference is not less than a predetermined value or not more than a predetermined value. In order to detect an intensity of the outside magnetic field as a numerical value, the following circuit may be used. A relation between the ratio or difference, which is between the resistance of the magnetic resistance element 1 used for detection and the resistance of the magnetic resistance element 2 used for reference, and the intensity of the outside magnetic field is previously stored in a memory and the ratio or difference, which is between the resistance of the magnetic resistance element 1 used for detection and the resistance of the magnetic resistance element 2 used for reference, is compared with and referred to a value on the table and the result of the comparison may be outputted from the circuit.

As described above, in Embodiment 1, the magnet 4 impresses a magnetic field, the magnetic intensity of which is higher than the intensity of the saturation magnetic field, in the direction in which the magnetic resistance element 2 used for reference feels magnetism. Therefore, its resistance is not substantially affected by the outside magnetic field 41, and it becomes possible to obtain a magnetic resistance element used for reference suitable for correcting a change in the resistance depending upon the temperature of the magnetic resistance element 1 used for detection.

The magnetic field, which is impressed upon the magnetic resistance element 2 used for reference from the magnet 4 in the facial direction of the layer structure, has a magnetic intensity higher than the magnetic intensity of the saturation magnetic field in parallel with the magnetizing direction of the fixed layer. Therefore, the resistance of the magnetic resistance element 2 used for reference becomes minimum. The value becomes peculiar to the element. Therefore, for example, compared with a case in which the chip resistance is externally attached, the accuracy can be enhanced at the time of manufacture. As a result, the accuracy of the magnetic field detector can be enhanced. In the case where the magnetic field, which is impressed upon the magnetic resistance element 2 used for reference by the magnet 4 in the facial direction of the layer structure, has a magnetic intensity higher than the magnetic intensity of the saturation magnetic field not in parallel with the magnetizing direction of the fixed layer, the resistance of the magnetic resistance element 2 used for reference becomes maximum. In this case, the value also becomes peculiar to the element. Therefore, the accuracy of the magnetic field detector can be enhanced.

A magnetic field is impressed upon the magnetic resistance element 1 used for detection by the magnet 4 only in the direction in which the magnetic resistance element 1 does not feel magnetism. Therefore, the outside magnetic field 41 is detected without being affected by the magnet 4. Accordingly, the detection circuit can be simplified. A magnetic field, the intensity of which is lower than that of the saturation magnetic field, may be impressed by the magnet 4 in the direction in which the magnetic resistance element 1 used for detection feels magnetism. However, in this case, a range of the magnetic intensity of the outside magnetic field 41, which can be detected by the magnetic resistance element 1 used for detection, is changed. Therefore, it becomes necessary to provide a detection circuit in which consideration is given to the change in the magnetic intensity range.

When an intensity of the magnetic field impressed upon the magnetic resistance element 2 used for reference is sufficiently increased by the magnet 4, the magnetizing direction 34 of the free layer of the magnetic resistance element 2 used for reference is more strongly restricted. Therefore, it is possible to provide an effect of reducing an influence given to the magnetic resistance element 2 used for reference from a disturbance magnetic field.

In this connection, in Embodiment 1, the magnetic resistance element 1 used for detection and the magnetic resistance element 2 used for reference are made when the fixed layer, the insulating layer and the free layer formed on the same base board 3 are subjected to pattern processing. However, as long as the layer structure is the same, the fixed layer, the insulating layer and the free layer my be formed on a different base board. However, from the viewpoint of conducting correction, it is clear that a change in the resistance of the magnetic resistance element 2 used for reference is as close as possible to the change of the magnetic resistance element 1 used for detection. Therefore, it is desirable that the magnetic resistance element 1 used for detection and the magnetic resistance element 2 used for reference are simultaneously formed on the same base board in the same process. According to the aforementioned film forming method and the photo-lithography method, when the formation is simultaneously executed, fluctuation is very small. Therefore, a crucial fluctuation is seldom caused in the detection of the magnetic resistance. Therefore, the substantially same structure and characteristic can be easily obtained.

As long as the magnetic resistance element 1 used for detection and the magnetic resistance element 2 used for reference have the same layer structure, the shapes may not be necessarily the same. For example, the shape of the magnetic resistance element 2 used for reference may be formed into a shape, the resistance of which is half of the resistance of the magnetic resistance element 1 used for detection. Even in this case, an influence of the resistance change depending upon the temperature can be corrected by the circuit for detecting the ratio of the resistance.

Embodiment 2

Figure 7:
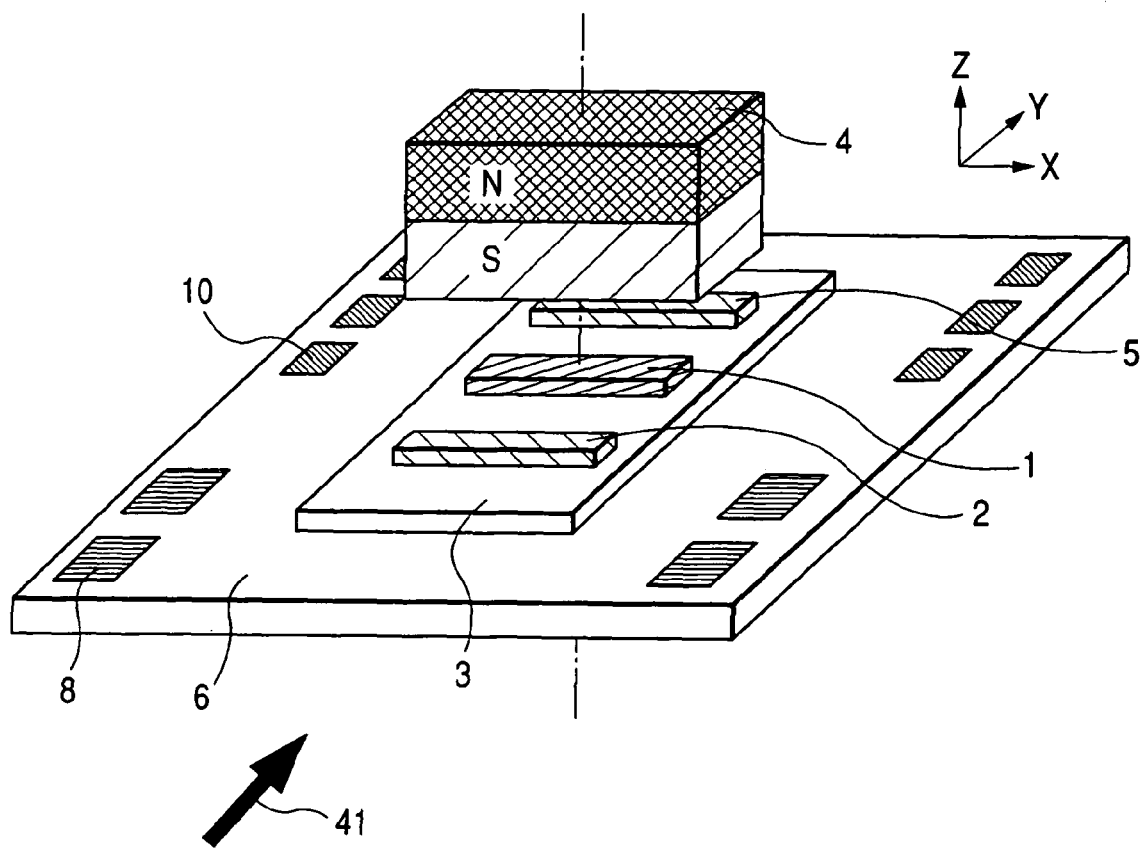
FIG. 7 is a perspective view showing a structure of the magnetic field detector of Embodiment 2.
Figure 8:
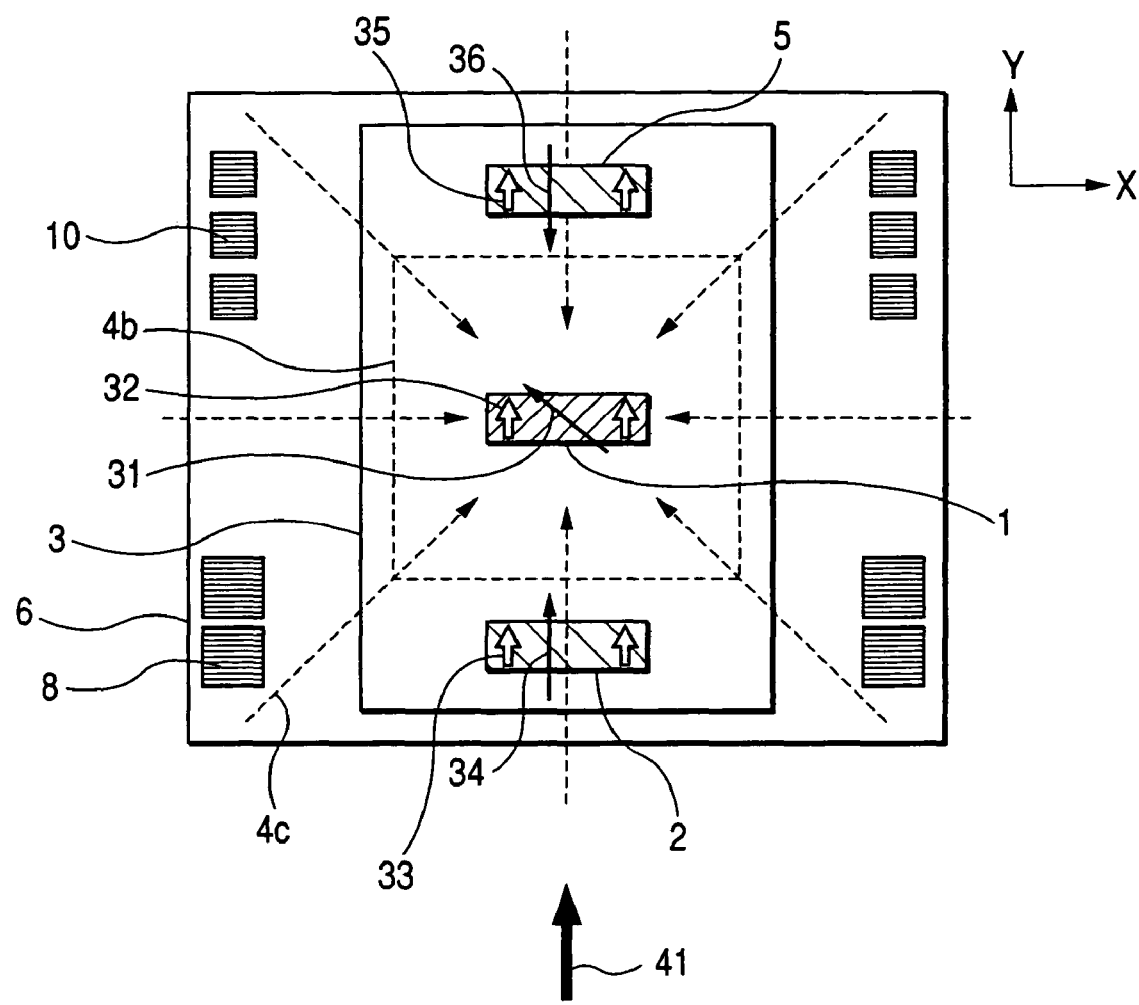
FIG. 8 is an upper view showing a structure of the magnetic field detector of Embodiment 2.

FIG. 7 is a perspective view showing a structure of the magnetic field detector of Embodiment 2. FIG. 8 is an upper view of the magnetic field detector shown in FIG. 7, wherein the view is taken in the direction of Z-axis. In Embodiment 2, in addition to Embodiment 1, the second magnetic resistance element 5 used for reference is arranged in the same direction as the magnetizing direction 31 of the fixed layer of the magnetic resistance element used for detection. All the magnetic resistance elements 2, 5 used for reference and the magnetic resistance element 1 used for detection are TMR elements formed on the same base board 3. The magnetizing direction of the fixed layer of the magnetic resistance element 2 used for reference and that of the magnetic resistance element 5 used for reference are parallel with each other, and the direction of the magnetic field impressed by the magnet 4 in the facial direction of the layer structure upon the magnetic resistance element 2 used for reference is opposite to that of the magnetic field impressed by the magnet 4 in the facial direction of the layer structure upon the magnetic resistance element 5 used for reference.

In Embodiment 2, the base board 3 is attached to the base board 6 used for wiring. Although not shown in FIG. 6, on the base board 6 used for wiring, the detection circuit shown in FIG. 11 for correcting an influence of the resistance change depending upon the temperature is provided. Wiring is made between the detection circuit and the magnetic elements by means of wire bonding. The adjustment electrode 10 is provided which is used at the time of measuring the resistance of each magnetic resistance element when the position is adjusted. Wiring is executed by means of wire bonding between the electrode 10 for adjustment and each magnetic resistance element.

When no outside magnetic field exists, the magnetizing direction of the free layer of the magnetic resistance element 1 used for detection and the magnetizing directions of the free layers of the magnetic resistance elements 2, 5 used for reference are perpendicular to the fixed layer. The above constitution can be realized, for example, when the free layer is patterned into a long slender rectangle and the shape anisotropy is utilized. However, the above constitution can be realized when the crystal magnetic anisotropy is utilized by impressing an magnetic field at the time of depositing the ferromagnetic film. The above constitution can be also realized when the magnetizing direction of the free layer is rotated by conducting heat treatment in an appropriate magnetic field after the magnetizing direction of the fixed layer was determined.

Figure 9:
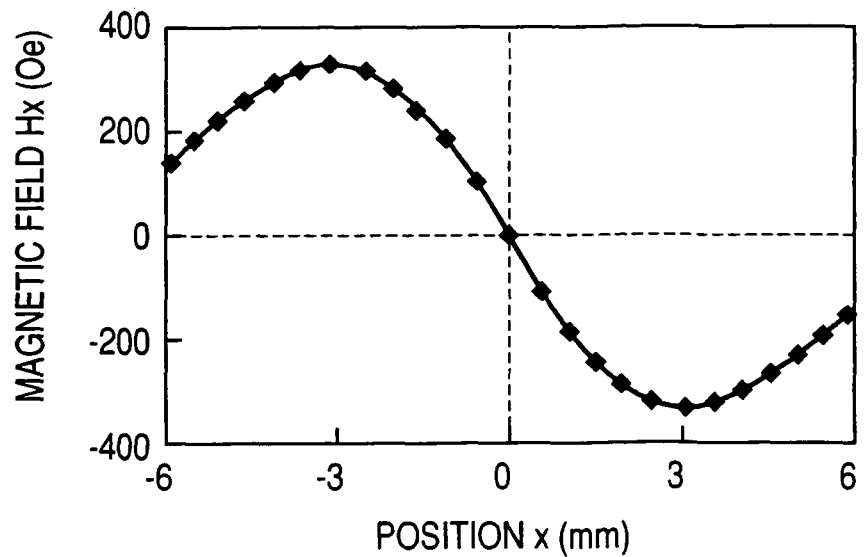
FIG. 9 is a graph showing a relation between the intensity of a magnetic field impressed by a magnet and the position on a base board.

The magnetic field, which is made by the magnet 4 at the position of the magnetic resistance element 1 used for detection, is perpendicular to the film structure of the element, that is, the magnetic field, which is made by the magnet 4 at the position of the magnetic resistance element 1 used for detection, is in the direction in which the magnetic resistance element 1 used for detection does not feel magnetism. Accordingly, the resistance of the magnetic resistance element 1 used for detection is not affected by the magnet 4 but changed according to the outside magnetic field. On the other hand, the magnetic field given by the magnet 4 to the magnetic resistance elements 2, 5 used for reference makes a certain angle with the film structure of the element. Since the impressed magnetic field H has a component on the face, the magnetic field is impressed upon the magnetic resistance elements 2, 5 used for reference by the magnet 4 in the direction in which the magnetic resistance elements 2, 5 used for reference feel magnetism. In the case where an intensity of the magnetic field impressed upon the elements is sufficiently strong and an intensity of the component of the magnetic field H on the face becomes higher than that of the saturation magnetic field ($H_k$), the magnetic resistance of the element becomes the same as the magnetic resistance in the saturation region. As shown in FIG. 9, the magnetizing direction of the free layer and the magnetizing direction of the fixed layer are parallel with each other in the magnetic resistance element 2 used for reference and not parallel with each other in the magnetic resistance element 5 used for reference, and the values are respectively the minimum ($R_{min}$) and the maximum ($R_{max}$). On the other hand, the magnetizing direction 32 of the magnetic resistance element 1 used for detection when the outside magnetic field does not exist is perpendicular to the magnetizing direction of the fixed layer. The magnetizing direction 33 of the magnetic resistance element 1 used for detection when the outside magnetic field exists is changed according to the direction of the outside magnetic filed.

FIG. 9 is a graph showing a relation between the intensity of the magnetic field impressed by the magnet 4 and the position on the base board. The magnet used here was a samarium cobalt magnet, the magnetic poles of which were square planes whose one side was 5 mm long, and the distance between the magnetic poles of which was 2 mm. In this case, the magnet was arranged being separate from the base board by 3 mm. In the case where the size of the magnetic resistance element 1 used for detection is reduced to 10 micron square, in the case where the magnetic resistance element 1 used for detection is placed at the center, it can be assumed that the magnetic field in the facial direction impressed upon the magnetic resistance element 1 used for detection is approximately zero. When the magnetic resistance elements 2, 5 used for reference are placed on both sides being separate from the magnetic resistance element 1 used for detection by 2 mm, a magnetic field of about 290 Oe is impressed upon the magnetic resistance elements 2, 5 used for reference. For example, in the case of using TMR element having the characteristic shown in FIG. 3, an intensity of this magnetic field is sufficiently strong for saturating the magnetic resistance elements 2, 5 used for reference.

When the magnetic resistance element 1 used for detection and the magnetic resistance elements 2, 5 used for reference are made into the same shape by the same process, the temperature characteristic and the structure of the magnetic resistance element 1 used for detection and the temperature characteristic and the structure of the magnetic resistance elements 2, 5 used for reference become substantially the same. Accordingly, the resistance changes depending upon the temperature of the magnetic resistance element 1 used for detection and the magnetic resistance elements 2, 5 used for reference are the same. With respect to the resistance value of the magnetic resistance element 1 used for detection, it is possible to correct an influence of the resistance change depending upon the temperature of the magnetic resistance element by using the resistance values $R_{min}$, $R_{max}$ and $H_k$ of the magnetic resistance elements 2, 5 used for reference. Therefore, it is possible to find an outside magnetic field with high accuracy.

Figure 10:
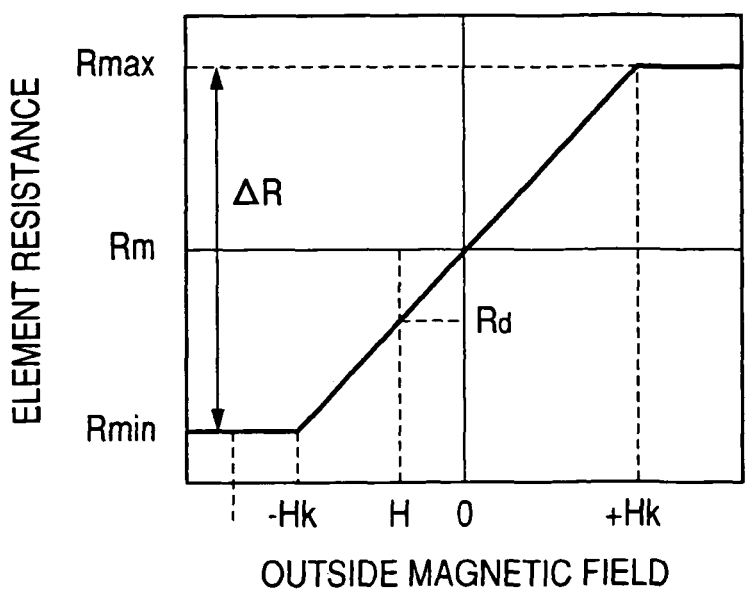
FIG. 10 is a graph showing a relation between the outside magnetic field and the element resistance of TMR element.

Next, explanations will be made into a detecting action of detecting an outside magnetic field for correcting an influence of a change in the resistance depending upon the temperature. FIG. 10 is a graph briefly showing a relation between the outside magnetic field and the element resistance of TMR element. In FIG. 10, the resistance $R_d$ of the magnetic resistance element used for detection at the time of the outside magnetic field H ($-|Hk| \leq H \leq |Hk|$) can be expressed by the following expression.

$$R_d = R_{min} + (R_{max} - R_{min})(H/2|H_k| + 1/2)$$

Therefore, the following expression can be obtained.

$$(R_d - R_{min})/(R_{max} - R_{min}) = (H/2|H_k|) + 1/2$$

In this connection, a difference of the resistance between the magnetic resistance elements is obtained by ($R_d - R_{min}$) and ($R_{max} - R_{min}$), it is possible to cancel a change in the resistance depending upon the temperature.

Figure 11:
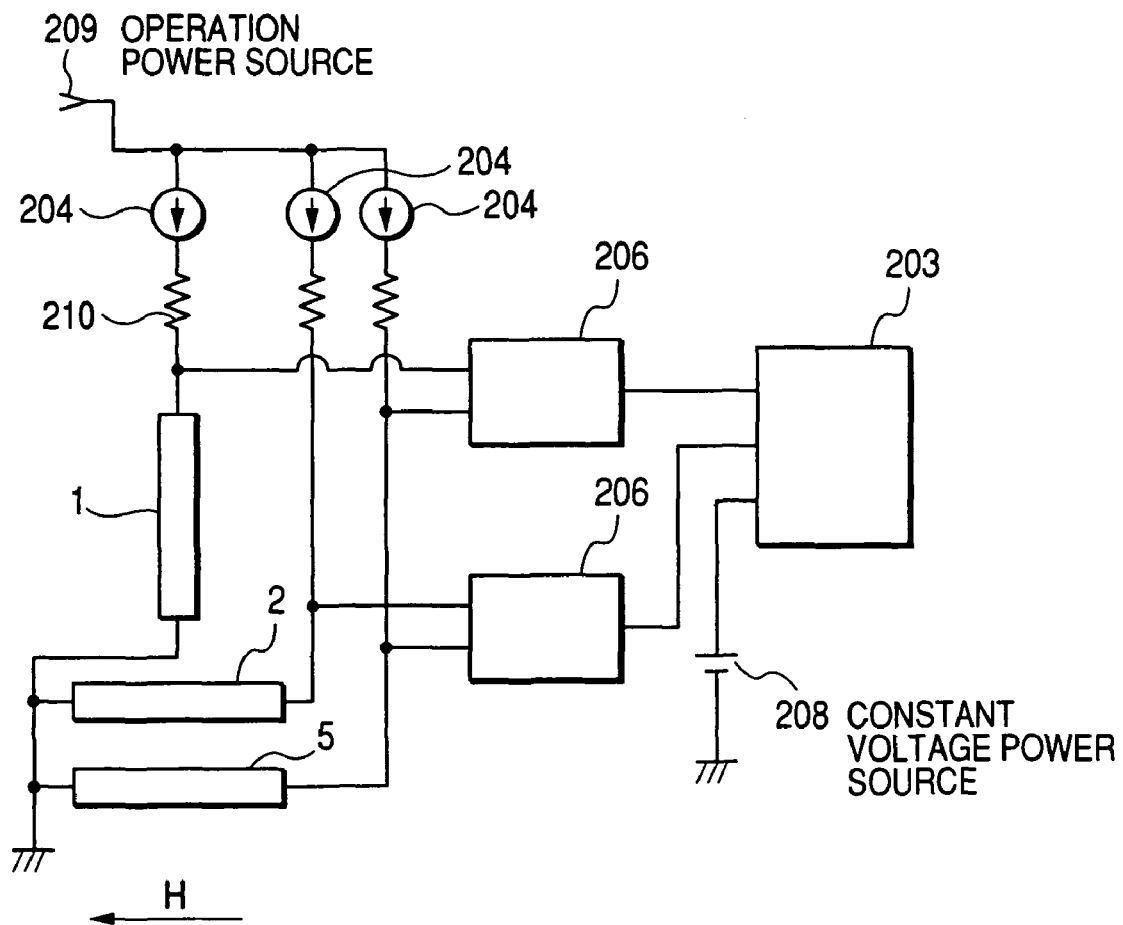
FIG. 11 is an arrangement view showing an arrangement of the detection circuit of the magnetic detector of Embodiment 2.

FIG. 11 is an arrangement view of the detection circuit of detecting an outside magnetic field for correcting an influence of the resistance change depending upon the temperature. As shown in FIG. 11, the constant electric current source 204 is connected to the magnetic resistance element 1 used for detection and the magnetic resistance elements 2, 5 used for reference so that the same electric current can be made to flow in each element. Although the electric current is changed by the resistance change in the magnetic resistance element, when the resistor 210, the resistance value of which is sufficiently higher than that of the magnetic resistance element, is arranged between the constant electric current power source 204 and the magnetic resistance element, the electric current flowing in the magnetic resistance element is made to be substantially the same. In this case, the resistance of the magnetic resistance element 2 used for reference is made to $R_{min}$, and the resistance of the magnetic resistance element 5 used for reference is made to $R_{max}$. Therefore, when a difference between the voltage of both end portions of the magnetic resistance element 1 used for detection and the voltage of both end portions of the magnetic resistance element 2 used for reference is amplified by the differential amplifying circuit 206 and when a difference between the voltage of both end portions of the magnetic resistance element 2 used for reference and the voltage of both end portions of the magnetic resistance element 5 used for reference is amplified by another differential amplifying circuit 207 and then the amplified values are calculated by the multiplying and dividing circuit 203, it is possible to find the value of $(R_d - R_{min})/(R_{max} - R_{min})$ According to the above expression, this value is equal to $(H/2|H_k|) + 1/2$. Further, the value of $|Hk|$ has already been known, an influence of the resistance change depending upon the temperature is corrected and the outside magnetic field H can be detected.

The detection circuit described above can be arranged not on the base board 6 for wiring like Embodiment 1 but on the base board 3 on which the magnetic resistance elements are arranged. Further, it is possible to arrange the above detection circuit outside the base board 6 for wiring and the base board 3. In the case where the detection circuit is arranged on the same base board, it is possible to reduce the generation of noise caused in the long wire provided between the magnetic resistance element and the amplifier of the first stage, so that the detection accuracy can be enhanced.

Concerning the method of finding the temperature correction and the outside magnetic field, the following method may be adopted. An exclusive detection circuit is not provided but a resistance value of each magnetic resistance element is read out by a resistance meter connected to the electrode 10 used for adjustment, and thus read value is inputted into a general purpose computer, so that a difference or ratio of the resistance value of each magnetic resistance element can be calculated.

In this case, an influence of the resistance change depending upon the temperature is corrected by the circuit in which a difference between the resistance value $R_{min}$, $R_{max}$ of the magnetic resistance element 2 used for reference and the resistance value R of the magnetic resistance element 1 used for detection is taken. However, an influence of the resistance change depending upon the temperature can be corrected even by the circuit in which a ratio of the resistance value of the magnetic resistance element 2 used for reference and the resistance value of the magnetic resistance element 1 used for detection is taken.

In the manufacture of the magnetic field detector, it is necessary to highly accurately decide positions of the magnet and the magnetic resistance element used for detection. As an example, the magnet is positioned by the following procedure. First of all, constant electric currents are respectively made to flow in the magnetic resistance element 1 used for detection and the magnetic resistance elements 2, used for reference, and voltage at both end portions is measured. Since both the magnetic resistance elements 2, 5 used for reference are in the saturation region, voltage at both end portions is decided by $R_{min}$ and $R_{max}$. Therefore, the value of voltage is seldom changed even when the magnet position is a little moved. On the other hand, the resistance value of the magnetic resistance element 1 used for detection is greatly changed according to a change in the magnetic field. However, in the case where the magnetic field is not impressed, the resistance value should be $R = (R_{min} + R_{max})/2$. Therefore, when the position of the magnet is adjusted so that the expression $R = (R_{min} + R_{max})/2$ can be satisfied, the direction of the magnetic field generated by the magnet coincides with the direction in which the magnetic resistance element 1 used for detection does not feel magnetism.

Accordingly, when a relative position between the magnet and the magnetic resistance element 1 used for detection is adjusted so that an average value of the resistance value of the magnetic resistance element 2 used for reference, upon which the magnetic field higher than the saturation magnetic field is impressed in parallel with the magnetizing direction of the fixed layer, and the resistance value of the magnetic resistance element 5 used for reference, upon which the magnetic field higher than the saturation magnetic field is impressed not in parallel with the magnetizing direction of the fixed layer, can be equal to the resistance value of the magnetic resistance element used for detection, it is possible to easily impress a magnetic field by the magnet only in the direction in which the magnetic resistance element 1 used for detection does not feel magnetism.

As described above, an average value of the resistance value of the magnetic resistance element 2 used for reference, upon which the magnetic field higher than the saturation magnetic field is impressed in parallel with the magnetizing direction of the fixed layer, and the resistance value of the magnetic resistance element 5 used for reference, upon which the magnetic field higher than the saturation magnetic field is impressed not in parallel with the magnetizing direction of the fixed layer, is made to be a reference value used for adjusting the relative position between the magnetic resistance element 1 used for detection and the magnet 4. However, the value used for adjusting the relative position between the magnetic resistance element 1 used for detection and the magnet 4 is not necessarily the average value. For example, a weighed average value of the resistance value of the magnetic resistance element 2 used for reference, upon which a magnetic field higher than the saturation magnetic field is impressed in parallel with the magnetizing direction of the fixed layer, and the resistance value of the magnetic resistance element 2 used for reference, upon which a magnetic field higher than the saturation magnetic field is impressed not in parallel with the magnetizing direction of the fixed layer, may be used as a reference value. Alternatively, a value obtained when the average value is offset by a predetermined value, may be a reference value. Alternatively, a value obtained when the average value is multiplied by a coefficient, which is related to the resistance value of the magnetic resistance element used for reference and the area ratio of the magnetic resistance element used for detection, may be used as the reference value.

Figure 12:
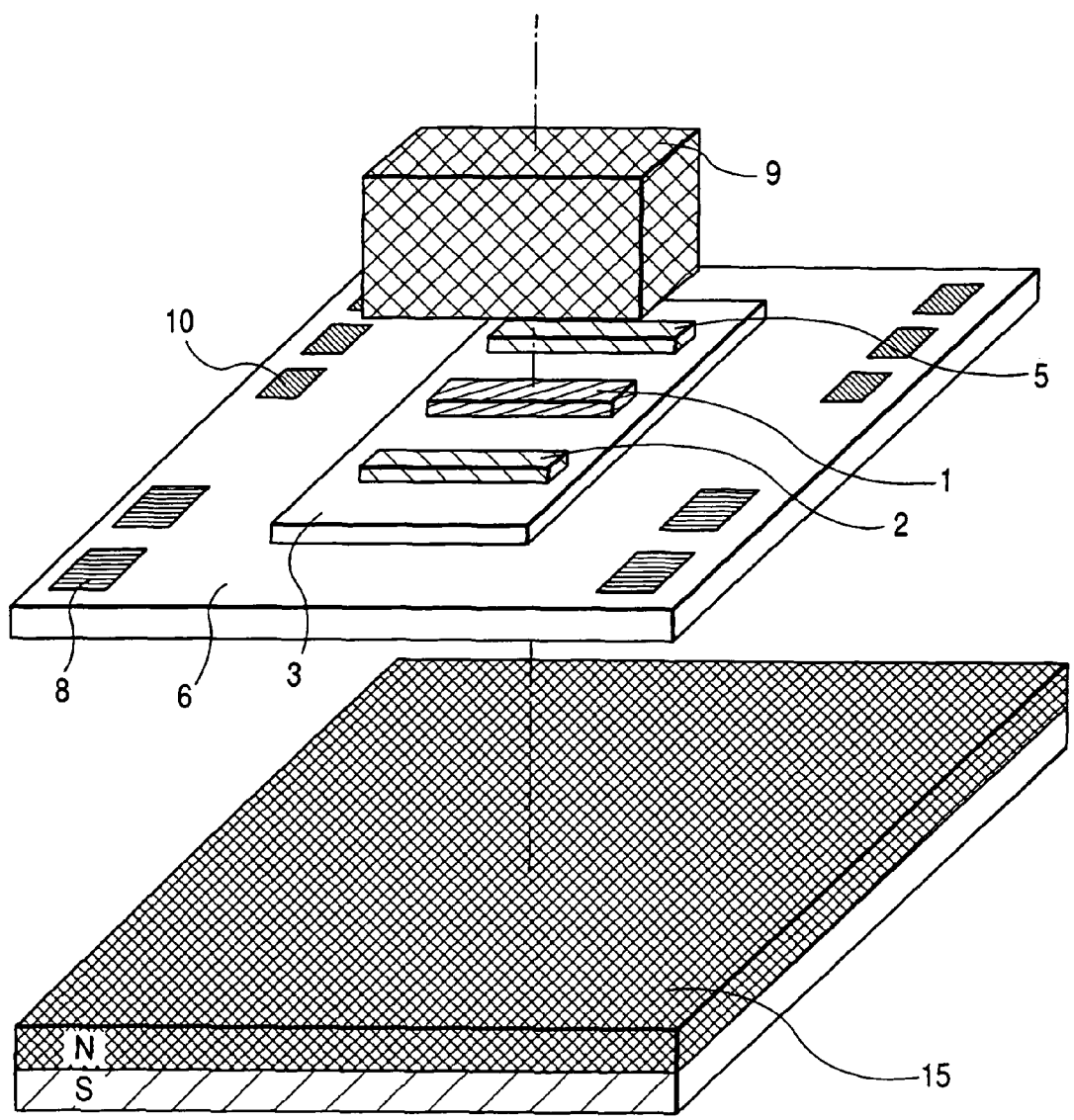
FIG. 12 is a perspective view showing an intermediate stage of the method of manufacturing the magnetic detector of Embodiment 2.

As another method of manufacturing the magnetic field detector, a method of using magnetic material which has not been magnetized yet, is provided. FIG. 12 is a perspective view showing an intermediate stage of the method of using magnetic material which has not been magnetized yet. First of all, the base board 3 is made to adhere onto the circuit board 6, and then the electrode wiring is conducted between the magnetic resistance elements and the electrodes 10 for adjustment by means of wire bonding. Next, as shown in FIG. 12, the magnetic material 9, which has not been magnetized yet, is arranged above the magnetic field detector and the magnet 15 for detecting the center is made to come close via the base board 3 from the opposite side. This magnet 15 for detecting the center is magnetized so that a magnetic field can be impressed upon the base board 3 in the vertical direction. Further, the size of the magnet 15 for detecting the center is sufficiently large so that a uniform magnetic field can be impressed upon the magnetic field detector. However, the magnet 15 for detecting the center is set in such a manner that a weak magnetic field is impressed so that the magnetic material 9, which has not been magnetized yet, can not be magnetized. Then, the magnetic field generated by the magnet 15 for detecting the center flows being concentrated upon the magnetic material 9 which has not been magnetized yet. Therefore, unless the magnetic resistance element 1 used for detection and the magnet are arranged perpendicularly to each other, a magnetic field in the facial direction of the element is generated in the magnetic resistance element 1 used for detection. Therefore, it is possible to detect a shift of the resistance. While this detection is being conducted, the position of the magnetic material, which has not been magnetized yet, is finely adjusted and fixed. Finally, a sufficiently high intensity of magnetic field is impressed upon the magnetic material 9 which has not been magnetized yet so as to magnetize the magnetic material. In this way, the magnet can be formed and the desired magnetic detector can be completed.

The magnetic field detector can be manufactured by another method. For example, the magnetic field detector can be manufactured by a method in which the position of the magnet 4 and the position of the magnetic resistance element 1 used for detection are accurately made to agree with each other by means of optical positioning. Alternatively, the magnet 4 and the base board 3 may be previously made to adhere to each other with high accuracy and then arranged on the circuit board 6. Alternatively, the magnet 4, which has been previously magnetized, may be accurately arranged and fixed on the base board 3.

In this connection, in Embodiment 2, the magnetizing direction of the fixed layer of the magnetic resistance element 2 used for reference and the magnetizing direction of the fixed layer of the magnetic resistance element 5 used for reference are parallel with each other, and the magnetic field impressed by the magnet in the facial direction of the layer structure is parallel and not parallel with the magnetizing direction of the fixed layer, that is, in the opposite direction to each other. However, when a plurality of magnetic resistance elements used for reference are provided, the magnetizing directions of the fixed layers of which are parallel with each other and in which the magnetic field impressed by the magnet in the facial direction of the layer structure is in the opposite direction, the magnetizing direction, which is impressed by the magnet upon the magnetic resistance element used for reference, may not be necessarily parallel or not parallel with the magnetizing direction of the fixed layer. In the case where the magnetizing direction is parallel or not parallel with the magnetizing direction of the fixed layer, the resistance value of the magnetic resistance element used for reference is not fixed to the minimum value or the maximum value. However, when the resistance values of the two magnetic resistance elements used for reference, the direction of the magnetic field impressed by the magnet in the facial direction of the layer structure of which is in the opposite direction, are averaged, the resistance value becomes the same as that of the case in which the outside magnetic field is zero. Therefore, it is possible to correct the resistance value of the magnetic resistance element 1 used for detection.

Embodiment 3

Figure 13:
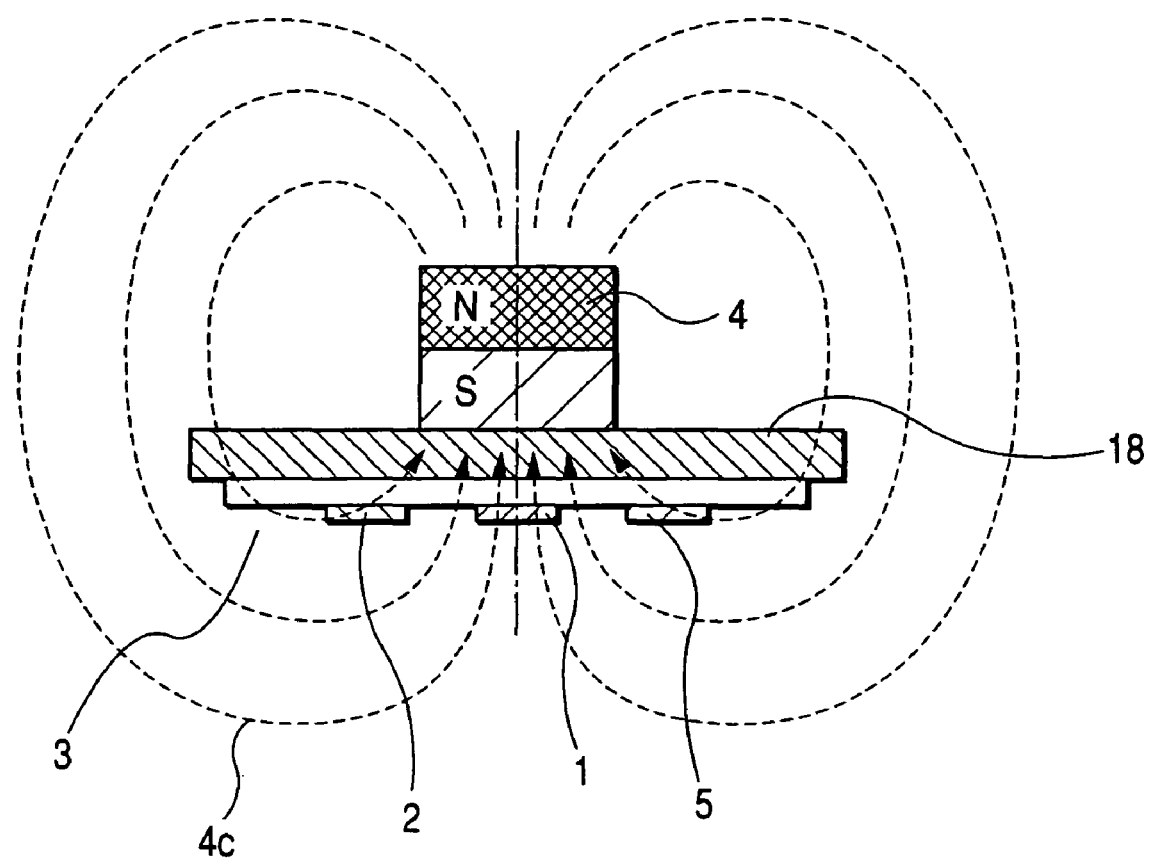
FIG. 13 is a sectional view showing a structure of the magnetic field detector of Embodiment 3.

FIG. 13 is a sectional view showing a magnetic field detector of Embodiment 3. The magnetic resistance element 1 used for detection and the magnetic resistance elements 2, 5 used for reference arranged on the base board 3 are the same as those of Embodiment 2. However, in this embodiment, the non-magnetic plate 18, both sides of which are formed into a plane, is further provided. In one plane portion of the non-magnetic plate 18, the end face of the magnetic pole is arranged being tightly contacted. In the other plane portion of the non-magnetic plate 18, the base board 3 of the magnetic resistance element 1 used for detection is arranged being tightly contacted.

The end face of the magnetic pole of the magnet 4 is a plane portion perpendicular to the magnetic field. The base board 3 of the magnetic resistance element 1 used for detection is parallel with the film structure of the magnetic resistance element 1 used for detection. Accordingly, when the base board 3 or the magnet 4 is adjusted in parallel with the plane portion of the non-magnetic plate 18, the magnetic field impressed upon the magnetic resistance element 1 used for detection by the magnet 4 can be easily adjusted in the direction perpendicular to the film structure that is a direction in which magnetism is not felt. On the other hand, with respect to the magnetic resistance elements 2, 5 used for reference, it is easy to impress the magnetic field in the direction in which magnetism is felt.

Embodiment 4

Figure 14:
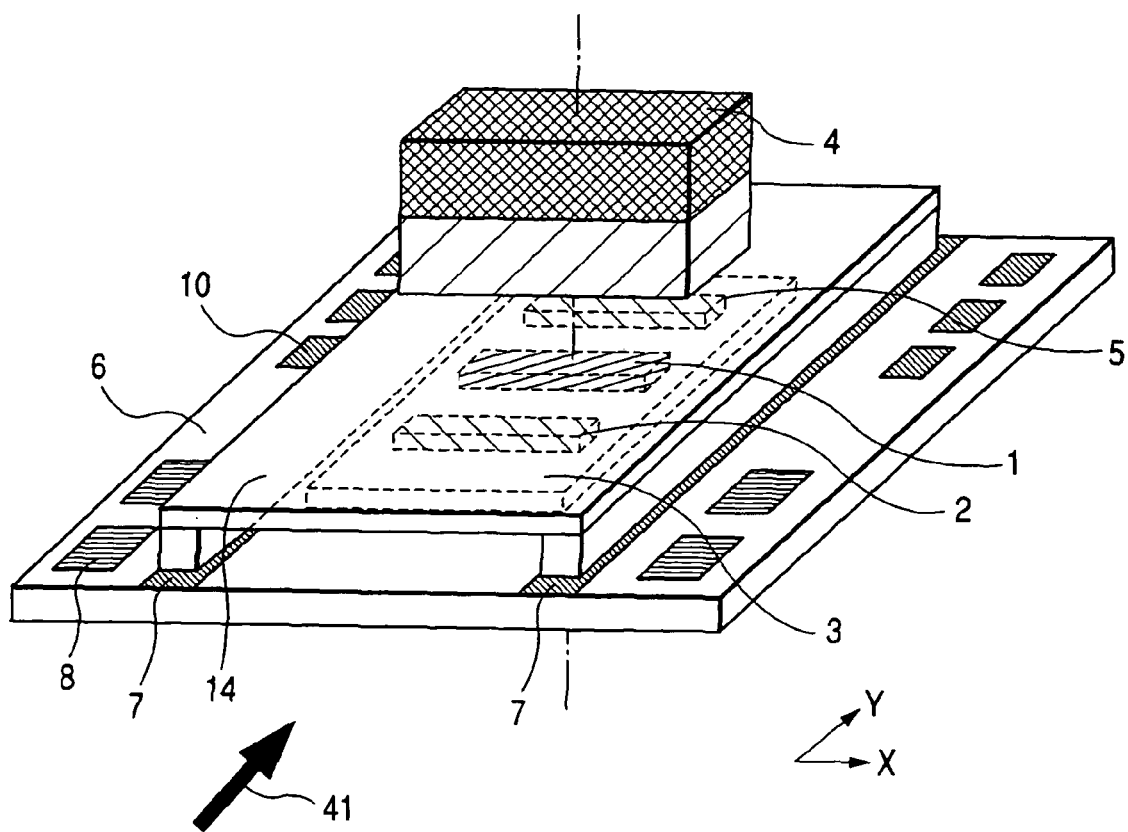
FIG. 14 is a perspective view showing a structure of the magnetic field detector of Embodiment 4.

FIG. 14 is a perspective view showing a structure of the magnetic field detector of Embodiment 4. In Embodiment 4, in addition to the structure of Embodiment 2, the magnetic flux guide 14 is arranged between the magnet and the magnetic resistance elements used for detection so that the magnetic resistance element 1 used for detection and the magnetic resistance elements 2, 5 used for reference can be covered by the magnetic flux guide 14 as shown in FIG. 14. The magnetic flux guide 14 is made of material, the magnetic permeability of which is high, and used for putting the directions of the magnetic fluxes in order. In this case, Permalloy is used for the material, the magnetic permeability of which is high. Between the magnetic flux guide 14 and the wiring base board 6, the insulating material 7 is provided. Therefore, the magnetic flux guide 14 and the wiring base board are electrically insulated from each other. In FIG. 14, Y-direction is defined as a direction in which the positions of the magnetic resistance elements 2, 5 used for reference are connected with each other, and X-direction is defined as a direction which is parallel with the base board 3 and perpendicular to Y-direction. Then, the direction of the outside magnetic field 41 to be detected agrees with Y-direction.

In this case, by the action of the magnetic flux guide 14, it is possible to suppress an influence of the disturbance magnetic field given from the outside except for the outside magnetic field. Further, when a positional relation between the magnetic flux guide 14 and the magnetic resistance element 1 used for detection is adjusted, in the case where the magnetic resistance element 1 used for detection is displaced, it is possible to reduce an intensity of the magnetic field impressed upon the magnetic resistance element 1 used for detection by the magnet 4.

Figure 15:
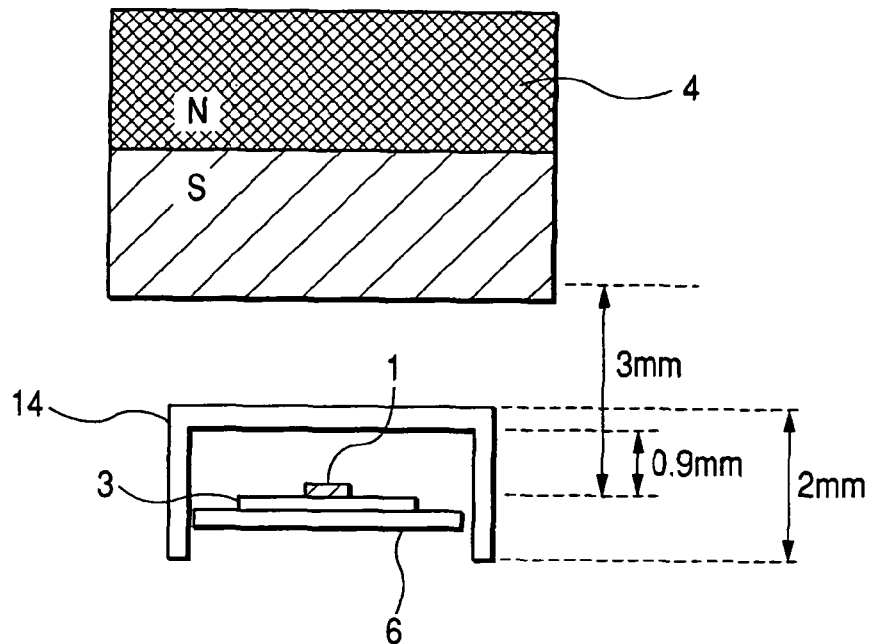
FIG. 15 is a sectional view showing a structure of the magnetic field detector of the variation of Embodiment 4.
Figure 16:
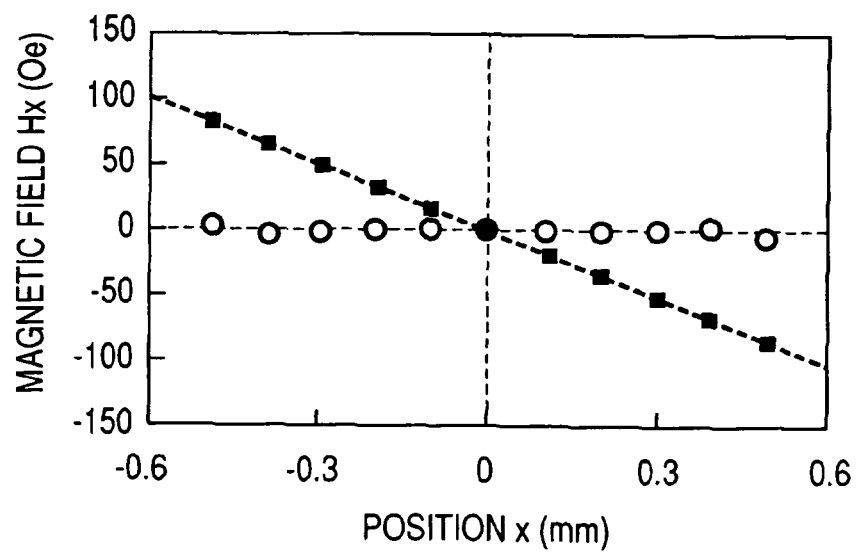
FIG. 16 is a graph showing a relation between the position on the base board and the magnetic field of the variation of Embodiment 4.

For example, in Embodiment 2 in which the magnetic flux guide 14 is not provided, in the case where the position of the magnetic resistance element 1 used for detection is displaced by 0.1 mm, the magnetic field, the intensity of which is 17 Oe, is impressed upon the magnetic resistance element 1 used for detection. FIG. 15 is a sectional view showing a structure of Embodiment 4 in which the magnetic guide, the height of the cross section of which 2 mm, the length in X-direction of the cross section of which is 3 mm, the length in Y-direction of which is 5 mm, is inserted into a position separate from the base board. FIG. 16 is a graph showing a relation between the position in X-direction on the base board and the intensity of the magnetic field in the case where the magnetic-flux guide 14 is provided and not provided in the structure shown in FIG. 15. When the magnetic flux guide 14 is provided, the relation between the position in X-direction on the base board and the intensity of the magnetic field becomes flat. In this connection, in FIG. 16, a change in the intensity of the magnetic field, which is caused by the displacement 0.1 mm in X-direction, is 0.5 Oe, and a change in the intensity of the magnetic field, which is caused by the displacement 0.1 mm in Y-direction, is 4.4 Oe, that is, the changes in the intensity of the magnetic field can be reduced. In this case, an intensity of the magnetic field, which is impressed upon the magnetic resistance element 2 used for reference separate in Y-direction by 2 mm, is 183 Oe. Therefore, in the same manner as that in the case where the magnetic guide 14 is not inserted, the saturation magnetic field can be impressed.

Even when the magnetic flux guide 14 is not located between the magnetic resistance elements 2, 5 used for reference and the magnet 4, as long as the magnetic flux guide 14 is located between the magnetic resistance element 1 used for detection and the magnet 4, the object can be accomplished. In this case, when the magnetic flux guide 14 is inserted, it is possible to provide the effects, in which an influence caused by the displacement of the magnetic resistance element 1 used for detection can be reduced, and the magnet 4 and the magnetic detector can be easily manufactured.

In this connection, it should be noted that the position and size of the magnetic flux guide 14 are not limited to the above specific embodiment. Of course, when the intensity and size of the magnet 4 are changed and when the distance between the magnetic resistance element 1 used for detection and the magnetic resistance elements 2, 5 used for reference is changed, the position and size of the magnetic flux guide 14 are changed from the above specific values; In this embodiment, the magnetic flux guide 14, the cross section of which is formed into a C-shape, is used, however, other shapes such as a thick plate may be used for the cross section of the magnetic flux guide 14.

Embodiment 5

Figure 17:
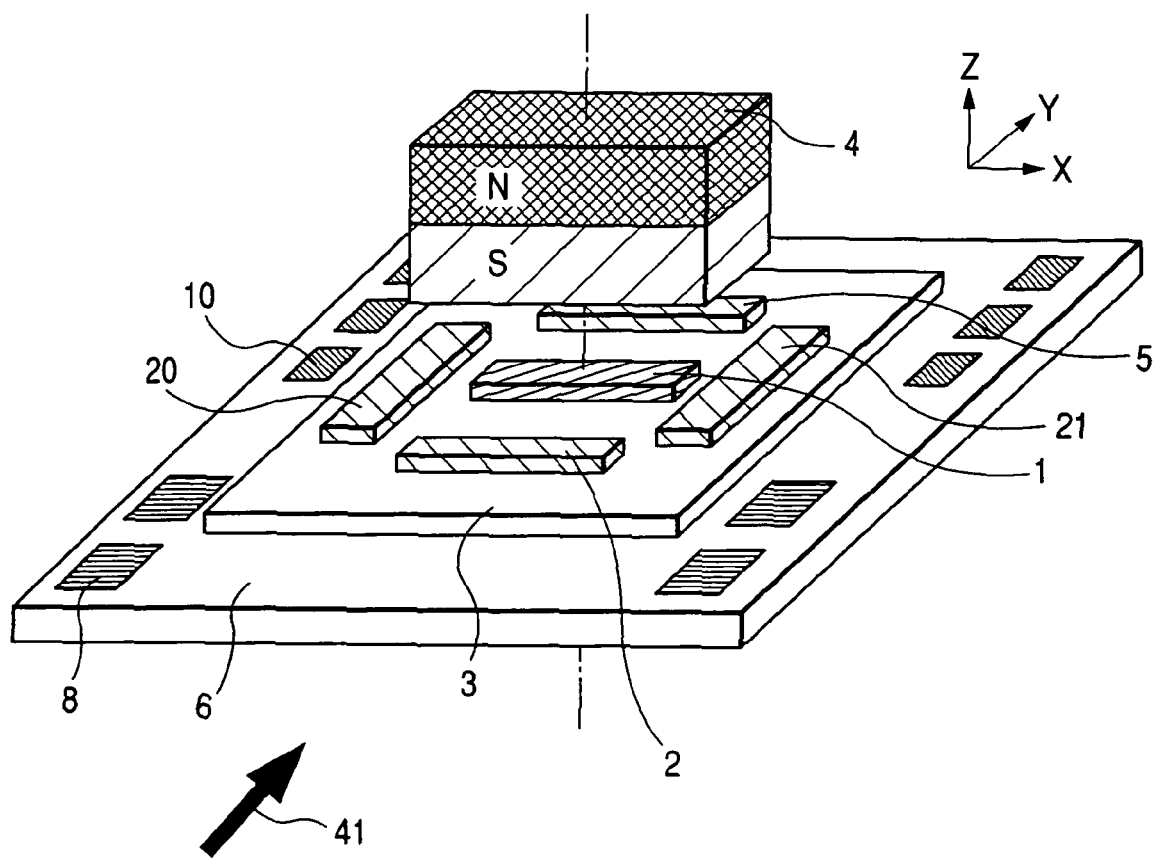
FIG. 17 is a perspective view showing a structure of the magnetic field detector of Embodiment 5.
Figure 18:
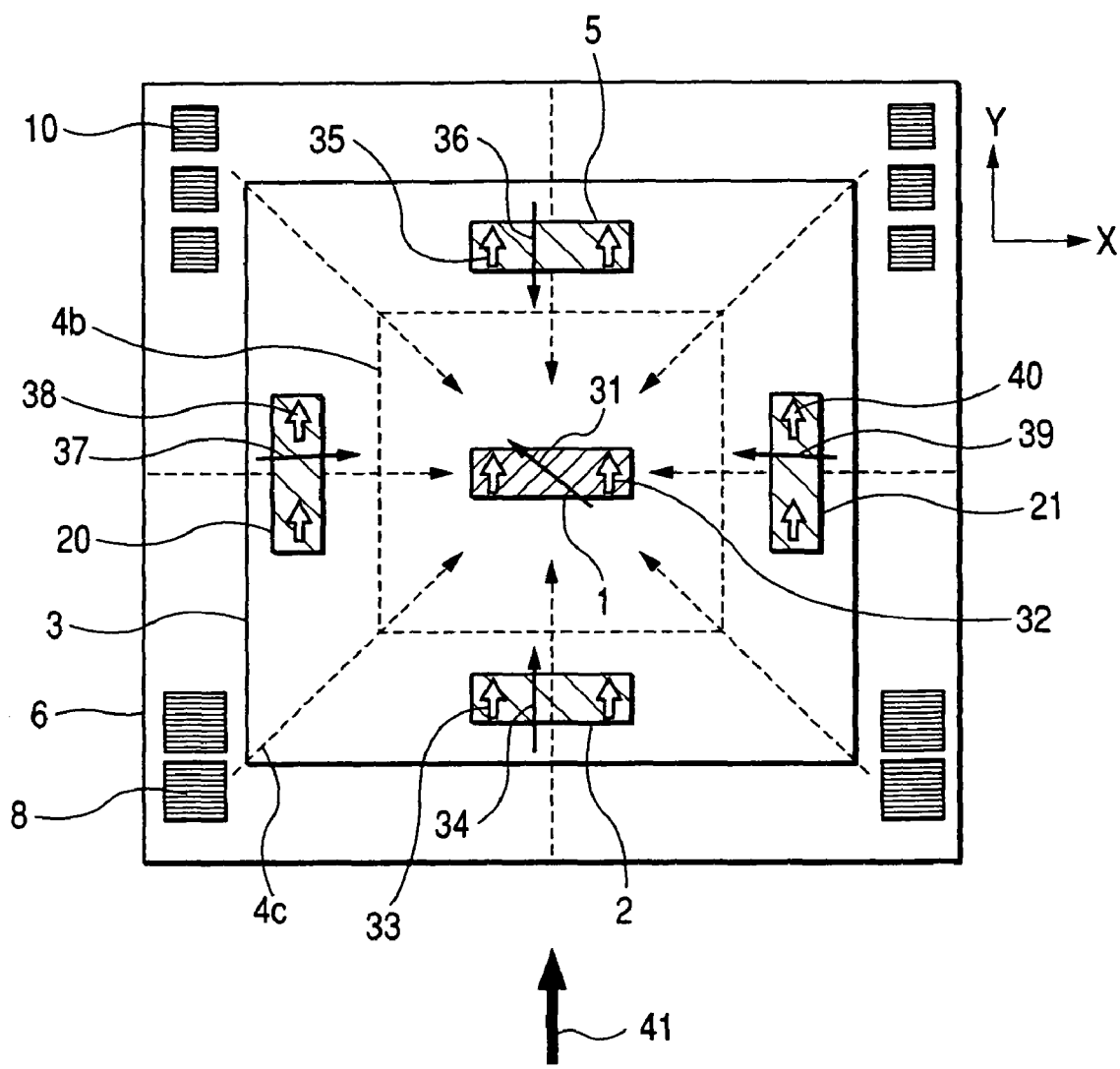
FIG. 18 is an upper view showing a structure of the magnetic field detector of Embodiment 5.

FIG. 17 is a perspective view showing a structure of the magnetic field detector of Embodiment 5. FIG. 18 is an upper view of the magnetic field detector shown in FIG. 17, wherein the view is taken in the direction of Z-axis from an upper portion of the base board 3. In Embodiment 5, in addition to the structure of Embodiment 2, the magnetic resistance elements 20, 21 used for reference are provided at positions while leaving an interval from the position of the magnetic resistance element 1 used for detection in two directions perpendicular to the magnetizing direction of the fixed layer of the magnetic resistance element loused for detection.

As shown in FIG. 18, the magnetic field perpendicular to the magnetizing direction of the fixed layer is impressed by the magnet 4 upon the magnetic resistance elements 20, 21 used for reference in the facial direction of the layer structure. An intensity of the magnetic field impressed by the magnet 4 in the facial direction of the layer structure is higher than the intensity of the saturation magnetic field of the magnetic resistance elements 20, 21 used for reference. Therefore, the magnetizing directions 37, 39 of the respective free layer are fixed in the direction perpendicular to the magnetizing direction of the fixed layer.

The resistance in the case where the magnetizing direction of the free layer is perpendicular to the magnetizing direction of the fixed layer is equal to the resistance in the case where the intensity of the outside magnetic field 41 is zero. Due to the above structure, from one of the resistance of the magnetic resistance element 20 used for reference and the resistance of the magnetic resistance element 21 used for reference, when an average of the resistance of the magnetic resistance element 20 used for reference and the resistance of the magnetic resistance element 21 used for reference is taken, it is possible to more accurately find a resistance at the time when an intensity of the magnetic field impressed from the outside is zero. When this value is used for one side of the differential amplifying circuit 203 of Embodiment 1, it is possible to accurately detect a magnetic field in the neighborhood of the magnetic field, the intensity of which is zero.

The structure of Embodiment 3 further includes the magnetic resistance element 20 used for reference and the magnetic resistance element 21 used for reference in which the magnetic field impressed by the magnet 4 in the facial direction of the layer structure is perpendicular to the magnetizing direction of the fixed layer. According to this structure, the resistance at the time when the intensity of the impressed magnetic field is zero can be used as a resistance for calibration. Accordingly, this structure is effectively applied to a case in which a low intensity of the magnetic field is more accurately detected.

In the magnetic field detector described in the above Embodiments 1 to 5, an element having the spin bulb structure is used for the magnetic resistance element. However, instead of the element having the spin bulb structure, an element, the fixed layer of which has SAF structure, may be used. In this case, when SAF structure is adopted, a leakage of the magnetic field from the fixed layer is reduced. Therefore, it is possible to suppress the magnetizing direction of the fixed layer from trembling by the outside magnetic field. Accordingly, the detection accuracy can be enhanced. This stricture can provides a remarkable effect when it is applied to a case in which the direction of impressing the magnetic field by the magnet 4 is not parallel with the magnetizing direction of the fixed layer like the magnetic resistance elements 20, 21 used for reference of Embodiment 2.

Embodiment 6

Figure 19:
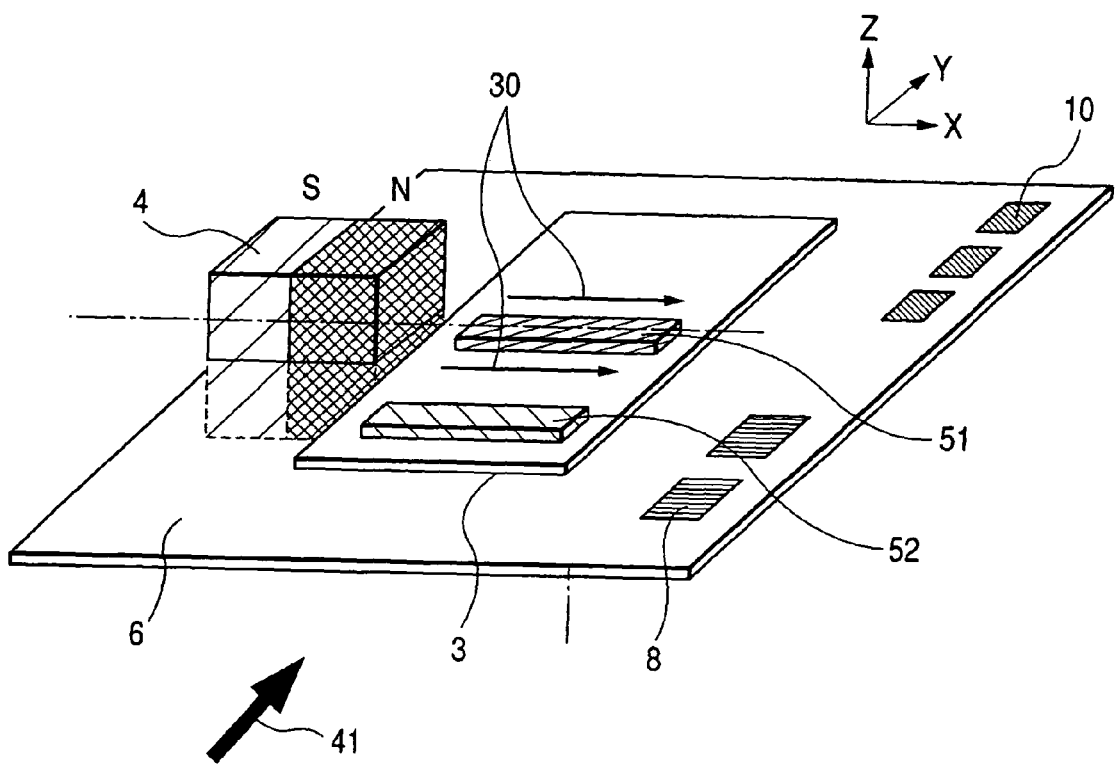
FIG. 19 is a perspective view showing a structure of the magnetic field detector of Embodiment 6.
Figure 20:
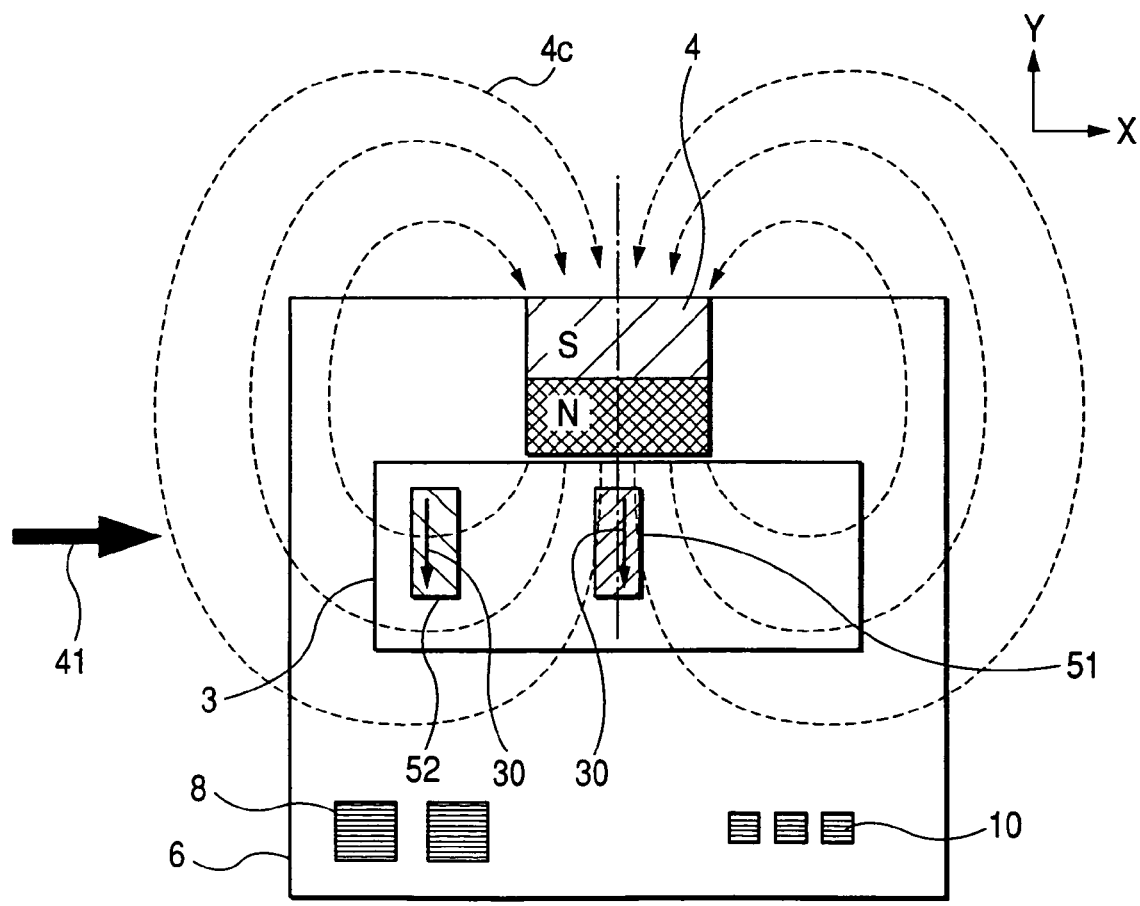
FIG. 20 is an upper view showing a structure of the magnetic field detector of Embodiment 6.

FIG. 19 is a perspective view showing a structure of the magnetic field detector of Embodiment 6. FIG. 20 is an upper view of the magnetic field detector shown in FIG. 19, wherein the view is taken in the direction of Z-axis from an upper portion of the base board face. This magnetic field detector is composed in such a manner that the magnetic resistance element used or detection and the magnetic resistance element used or reference in Embodiment 1 are replaced with AMR (Anisotropic Magneto-Resistance) elements, and the mutual positions of the magnet 4, the magnetic resistance element used for detection and the magnetic resistance element used for reference are changed. The layer structure of AMR element used here is not the spin bulb structure, however, AMR element used here is the same as TMR element of GMR element at the following points. The layer structure includes a ferromagnetic layer, the resistance is changed by the change in the magnetizing direction of the magnetic layer, and the magnetism is not felt in the direction perpendicular to the film structure. Some AMR elements do not substantially feel the magnetism in the direction parallel with the detection electric current. In Embodiment 4, AMR elements, which do not feel magnetism in the direction parallel with the detection electric current, are used for the magnetic resistance element 51 used for detection and the magnetic resistance element 52 used for reference. The magnet 4 is arranged so that an axis connecting the center of N-pole with the center of S-pole can substantially coincide with the direction of the detection electric current of the magnetic resistance element 51 used for detection. On the other hand, as can be understood from FIG. 20, the magnetic resistance element 52 used for reference is arranged so that the magnetic field of the magnet 4 can be in the direction substantially perpendicular to the detection current.

Since the magnetic field impressed upon the magnetic resistance element 51 used for detection by the magnet 4 is parallel with the direction of the detection electric current 30, the magnetic field does not affect the resistance of the magnetic resistance element 51 used for detection. On the other hand, in the magnetic resistance element 52 used for reference, a magnetic field, the intensity of which is sufficiently higher than the intensity of the saturation magnetic field, is impressed by the magnet 4 in the direction of feeling the magnetism. Therefore, the resistance of the magnetic resistance element 52 used for reference is substantially fixed to the resistance at the time of the saturation magnetic field. In the case of impressing the outside magnetic field 41, the resistance of the magnetic resistance element 51 used for detection is changed, however, the resistance of the magnetic resistance element 52 used for reference is not changed. Accordingly, even when AMR element is used, an influence of the resistance change depending upon the temperature of the magnetic resistance element 51 used for detection can be corrected by using the magnetic resistance element 52 used for reference.

A magnetic field detector includes: a magnet; a magnetic resistance element used for detection having a layer structure containing a ferromagnetic layer, the resistance of the magnetic resistance element being changed by a change in a magnetizing direction of the ferromagnetic layer; and a magnetic resistance element used for reference having the substantially same layer structure as that of the magnetic resistance element used for detection, wherein the magnet impresses a magnetic filed having an intensity not less than an intensity of a saturation magnetic field in a direction in which the ferromagnetic layer of the magnetic resistance element used for reference feels magnetism. Accordingly, without providing a magnetic shield, the magnetic detector having the magnetic resistance element used for reference can be realized. When this magnetic detector is used, the fluctuation of the characteristic, that is, the fluctuation of the temperature characteristic can be canceled and the outside magnetic field can be found with high accuracy.

In Embodiments 1 to 6 described above, TMR element or AMR element is used for the magnetic resistance element for detection and the magnetic resistance element for reference. However, as long as it is a magnetic resistance element, the magnetizing direction of the ferromagnetic layer of which is changed being affected by the outside magnetic field so that the resistance of the element can be changed, GMR element or other magnetic resistance elements may be used. Even in this case, when a magnetic field, the intensity of which is not less than the intensity of the saturation magnetic field of the ferromagnetic layer, is impressed in the direction in which magnetism of the magnet is felt, it is possible to obtain a magnetic resistance element for reference, the resistance of which is not changed by the outside magnetic field. Therefore, the effect of the invention can be provided.

A magnetic field, the intensity of which is lower than the intensity of the saturation magnetic field of the ferromagnetic layer, may be impressed upon the magnetic resistance element for detection in the direction in which magnetism of the magnet can be felt. In this case, a bias magnetic field is impressed upon the outside magnetic field, which is detected, by the magnet. Even in this case, it is possible to obtain a magnetic resistance element for reference, the resistance of which is not changed by the outside magnetic field. Therefore, the effect of the invention can be provided.

The magnet described in Embodiment 1 to 6 is a permanent magnet. However, the other magnetic flux generation means such as an electromagnet and a solenoid coil may be used. In the magnetic field detection described in Embodiment 1 to 3 described above, the object of detection is an outside magnetic field. This outside magnetic field may be a change in the magnetic field caused when a magnetized magnetic body is rotated or moved. Alternatively, this outside magnetic field may be a change in the magnetic field caused by a change in the electric current flowing in a coil of a copper wire. Alternatively, this outside magnetic field may be a sensor in which the magnetic field generated by the magnet provided in the magnetic field detector detects a change caused by a movement or a rotation of an object to be measured which is made of soft magnetic material. In this case, by the rotation and the movement of the object to be detected, an intensity of the magnetic field impressed upon the magnetic resistance element for reference is changed. However, when an intensity of the magnetic field impressed upon the magnet is sufficiently increased, a change in the resistance can be made to be substantially zero.

The magnet described in Embodiments 1 to 6 is a bar magnet, the magnetic pole end face of which is square. However, it is possible to use a bar magnet, the magnetic pole end face of which is circular, or a bar magnet, the magnetic pole end face of which is annular. In this case, when the magnetic resistance element 1 for detection is arranged on the central axis of the rod magnet, even if the magnet is rotated, the magnetic field impressed upon the magnetic resistance element 2 for reference is not changed. Therefore, the magnetic field detector can be easily manufactured. The shape of the magnet may be a hexagonal prism. Concerning the magnet used for impressing the magnetic field, instead of the samarium cobalt magnet, the ferrite magnet, the Alnico magnet, it is possible to use the neodymium magnet or the bond magnet.

What is claimed is:

1. A magnetic field detector comprising:
    a magnet;
    a detecting magnetic resistance element detecting an external magnetic field and having a layer structure including a ferromagnetic layer, the resistance of the detecting magnetic resistance element being changed by a change in magnetizing direction of the ferromagnetic layer; and
    a reference magnetic resistance element having substantially the same layer structure as the detecting magnetic resistance element, wherein the magnet impresses a magnetic field having an intensity not less than a saturation magnetic field of the reference magnetic resistance element in a direction in which the ferromagnetic layer of the reference magnetic resistance element senses a change in magnetic field.

2. The magnetic field detector according to claim 1, wherein:
    the layer structure of the reference magnetic resistance element includes a fixed layer, the magnetizing direction of which is fixed in one direction in the layer, and a free layer, in which the magnetizing direction of the ferromagnetic layer is changed upon being affected by the external magnetic field;
    the resistance of the reference magnetic resistance element is changed according to the magnetizing direction of the fixed layer and the magnetizing direction of the free layer; and
    intensity of the magnetic field which is impressed upon the reference magnetic resistance element by the magnet along the layer structure is not less than intensity of the saturation magnetic field of the reference magnetic resistance element in the direction parallel to or not parallel to the magnetizing direction of the fixed layer.

3. The magnetic field detector according to claim 2, further comprising a plurality of reference magnetic resistance elements, wherein
    the magnetizing directions of the fixed layers of the plurality of reference magnetic resistance elements are the same, and
    the magnetic fields impressed by the magnet along the layer structure are opposite to each other.

4. The magnetic field detector according to claim 2, wherein the magnetic field impressed on the reference magnetic resistance element by the magnet along the layer structure is perpendicular to the magnetizing direction of the fixed layer.

5. The magnetic field detector according to claim 2, wherein the detecting magnetic resistance element includes:
    a first anti-ferromagnetic layer;
    a first ferromagnetic layer contacting the first anti-ferromagnetic layer;
    a first non-magnetic layer contacting the first ferromagnetic layer on a face opposite the first anti-ferromagnetic layer; and
    a second ferromagnetic layer contacting the first non-magnetic layer on a face opposite the first ferromagnetic layer.

6. The magnetic field detector according to claim 2, wherein the detecting magnetic resistance element includes:
    a first anti-ferromagnetic layer;
    a first ferromagnetic layer contacting the first anti-ferromagnetic layer;
    a second non-magnetic layer contacting the first ferromagnetic layer on a face opposite the first anti-ferromagnetic layer;
    a third ferromagnetic layer contacting the second non-magnetic layer on a face opposite the first ferromagnetic layer;
    a first non-magnetic layer contacting the third ferromagnetic layer on a face opposite the second non-magnetic layer; and
    a second ferromagnetic layer contacting the first non-magnetic layer on a face opposite the third ferromagnetic layer.

7. The magnetic field detector according to claim 1, wherein the magnetic field is impressed by the magnet on the reference magnetic resistance element only in the direction in which the detecting magnetic resistance element does not sense a change in a magnetic field.

8. The magnetic field detector according to claim 1, further comprising a flat plate made of a non-magnetic material, wherein:
    the magnet includes a plane portion perpendicular to the magnetic field,
    the plane portion of the magnet is opposed to a first face of the flat plate, and
    the film structure of the detecting magnet resistance element is opposed to a second face of the flat plate.

9. The magnetic field detector according to claim 1, further comprising a circuit for detecting a difference between or a ratio of (i) the resistance of the detecting magnetic resistance element, and (ii) the resistance of the reference magnetic resistance element.

10. The magnetic field detector according to claim 1, further comprising a magnetic flux guide located between the detecting magnetic resistance element and the magnet.

11. The magnetic field detector according to claim 1, further comprising a circuit for amplifying a detected signal, commonly arranged on a substrate with the detecting magnetic resistance element and the reference magnetic resistance element.

12. A method of manufacturing a magnetic field detector including a detecting magnetic resistance element, the method comprising adjusting relative positions of a magnet and the detecting magnetic resistance element so that a reference value
- calculated from a resistance of the reference magnetic resistance element when a magnetic field, the intensity of which is not less than the intensity of the saturation magnetic field of the reference magnetic resistance element, is impressed parallel to a magnetizing direction of a fixed layer of the reference magnetic resistance element, and
- also calculated from the resistance of the reference magnetic resistance element when a magnetic field, the intensity of which is not less than the intensity of the saturation magnetic field of the reference magnetic resistance element, is impressed in a direction not parallel to the magnetizing direction of the fixed layer of the reference magnetic resistance element,
- is equal to the resistance of the detecting magnetic resistance element.

13. A magnetic field detector comprising:
a magnet;
a detecting magnetic resistance element detecting an external magnetic field and having a layer structure including a ferromagnetic layer, the resistance of the detecting magnetic resistance element being changed by a change in magnetizing direction of the ferromagnetic layer; and
first and second reference magnetic resistance elements having substantially the same layer structure as the detecting magnetic resistance element, wherein
  the detecting magnetic resistance element is substantially coplanar with the first and second reference magnetic resistance elements and is centrally disposed between the first and second reference magnetic resistance elements,
  the magnet impresses a magnetic field having an intensity not less than a saturation magnetic field of the first and second reference magnetic resistance elements in directions in which the ferromagnetic layers of the first and second reference magnetic resistance elements sense a change in magnetic field, and
  the magnet impresses a magnetic field in a direction in which the ferromagnetic layer of the detecting magnetic resistance element does not sense a change in magnetic field.

14. The magnetic field detector according to claim 13, wherein:
the layer structure of each of the first and second reference magnetic resistance elements includes a fixed layer, the magnetizing direction of which is fixed in one direction in the layer, and a free layer, in which the magnetizing direction of the ferromagnetic layer is changed upon being affected by the external magnetic field;
the resistance of each of the first and second reference magnetic resistance elements is changed according to the magnetizing direction of the fixed layer and the magnetizing direction of the free layer; and
intensity of the magnetic field which is impressed upon the first and second reference magnetic resistance elements by the magnet along the layer structure is not less than intensity of the saturation magnetic field of the first and second reference magnetic resistance elements in the direction parallel to or not parallel to the magnetizing direction of the fixed layer.

15. The magnetic field detector according to claim 14, wherein
the magnetizing directions of the fixed layers of the first and second reference magnetic resistance elements are the same, and
the magnetic fields impressed by the magnet along the layer structures are opposite to each other.

16. The magnetic field detector according to claim 14, wherein the magnetic field impressed on the first and second reference magnetic resistance elements by the magnet along the layer structures is perpendicular to the magnetizing direction of the fixed layers.

17. The magnetic field detector according to claim 14, wherein the detecting magnetic resistance element includes:
a first anti-ferromagnetic layer;
a first ferromagnetic layer contacting the first anti-ferromagnetic layer;
a first non-magnetic layer contacting the first ferromagnetic layer on a face opposite the first anti-ferromagnetic layer; and
a second ferromagnetic layer contacting the first non-magnetic layer on a face opposite the first ferromagnetic layer.

18. The magnetic field detector according to claim 14, wherein the detecting magnetic resistance element includes:
a first anti-ferromagnetic layer;
a first ferromagnetic layer contacting the first anti-ferromagnetic layer;
a second non-magnetic layer contacting the first ferromagnetic layer on a face opposite the first anti-ferromagnetic layer;
a third ferromagnetic layer contacting the second non-magnetic layer on a face opposite the first ferromagnetic layer;
a first non-magnetic layer contacting the third ferromagnetic layer on a face opposite the second non-magnetic layer; and
a second ferromagnetic layer contacting the first non-magnetic layer on a face opposite the third ferromagnetic layer.

19. The magnetic field detector according to claim 13, further comprising a flat plate made of a non-magnetic material, wherein:
the magnet includes a plane portion perpendicular to the magnetic field,
the plane portion of the magnet is opposed to a first face of the flat plate, and
the film structure of the detecting magnet resistance element is opposed to a second face of the flat plate.

20. The magnetic field detector according to claim 13, further comprising a circuit for detecting a ratio of (i) difference between the resistance of the detecting magnetic resistance element and the resistance of one of the first and second reference magnetic resistance elements, and (ii) difference between the resistances of the first and second reference magnetic resistance elements.

* * * * *